United States Patent
Emde et al.

(10) Patent No.: US 10,054,295 B2
(45) Date of Patent: Aug. 21, 2018

(54) LAMP COMPRISING AT LEAST ONE OLED LIGHTING MEANS

(71) Applicant: Emdedesign GmbH, Frankfurt am Main (DE)

(72) Inventors: Thomas Emde, Frankfurt am Main (DE); Christoph Petersen, Lich (DE); Jonathan Meier, Frankfurt am Main (DE)

(73) Assignee: Emdedesign GmbH, Frankfurt am Main (DE)

( * ) Notice: Subject to any disclaimer, the term of this patent is extended or adjusted under 35 U.S.C. 154(b) by 164 days.

(21) Appl. No.: 15/037,333

(22) PCT Filed: Nov. 17, 2014

(86) PCT No.: PCT/EP2014/074738
§ 371 (c)(1),
(2) Date: Aug. 5, 2016

(87) PCT Pub. No.: WO2015/071454
PCT Pub. Date: May 21, 2015

(65) Prior Publication Data
US 2016/0369981 A1  Dec. 22, 2016

(30) Foreign Application Priority Data

Nov. 18, 2013 (DE) .......................... 10 2013 112 694
Dec. 16, 2013 (DE) .......................... 10 2013 114 129
May 14, 2014 (DE) .......................... 10 2014 106 799

(51) Int. Cl.
*F21V 19/00* (2006.01)
*F21S 6/00* (2006.01)
(Continued)

(52) U.S. Cl.
CPC ............ *F21V 19/001* (2013.01); *F21S 6/003* (2013.01); *F21S 8/061* (2013.01); *F21V 3/02* (2013.01);
(Continued)

(58) Field of Classification Search
CPC . F21V 19/001; F21V 3/02; F21S 6/003; F21S 8/061; H01L 27/3293;
(Continued)

(56) References Cited

U.S. PATENT DOCUMENTS

2010/0046210 A1* 2/2010 Mathai .................... H01L 51/52
362/147
2013/0147398 A1 6/2013 Lu et al.

FOREIGN PATENT DOCUMENTS

DE 202006005427 U1 6/2006
DE 102011107642 A1 1/2013
(Continued)

*Primary Examiner* — Laura Gudorf
(74) *Attorney, Agent, or Firm* — Michael Soderman

(57) ABSTRACT

The present invention relates to a lamp comprising at least one OLED lighting means lying flat on an at least partially light-transmissive carrier plate (13) and formed as an OLED panel (14, 15, 16), in which at least two contact shoes respectively assigned to an OLED panel are attached on the rear side of the carrier plate that is facing away from the light-emitting side and respectively comprise means for contacting one pole each of the OLED panel. The solution according to the invention provides a lamp that ensures effective coupling out of the light emitted by the OLEDs and uniform distribution of the light over the light-radiating area of the carrier plate and at the same time is of a comparatively simple construction and an attractive design. The lamp according to the invention may for example be a pendant lamp, a suspended lamp, a surface-mounted ceiling lamp, a recessed ceiling lamp, a standard lamp or a table lamp.

19 Claims, 14 Drawing Sheets

(51) Int. Cl.
| | |
|---|---|
| *F21S 8/06* | (2006.01) |
| *H01L 51/52* | (2006.01) |
| *H01L 27/32* | (2006.01) |
| *F21V 3/02* | (2006.01) |
| *F21V 23/06* | (2006.01) |
| *F21Y 113/00* | (2016.01) |
| *F21Y 105/00* | (2016.01) |
| *F21Y 115/15* | (2016.01) |

(52) U.S. Cl.
CPC ...... *H01L 27/3293* (2013.01); *H01L 27/3297* (2013.01); *H01L 51/52* (2013.01); *H01L 51/5203* (2013.01); *F21V 23/06* (2013.01); *F21Y 2105/00* (2013.01); *F21Y 2113/00* (2013.01); *F21Y 2115/15* (2016.08); *H01L 2251/5361* (2013.01); *Y02B 20/36* (2013.01)

(58) Field of Classification Search
CPC . H01L 27/3297; H01L 51/52; H01L 51/5203; F21Y 2115/15
See application file for complete search history.

(56) References Cited

FOREIGN PATENT DOCUMENTS

| | | |
|---|---|---|
| DE | 102012007727 A1 | 10/2013 |
| WO | 2011/124689 A1 | 10/2011 |
| WO | 2013/116623 A1 | 8/2013 |

\* cited by examiner

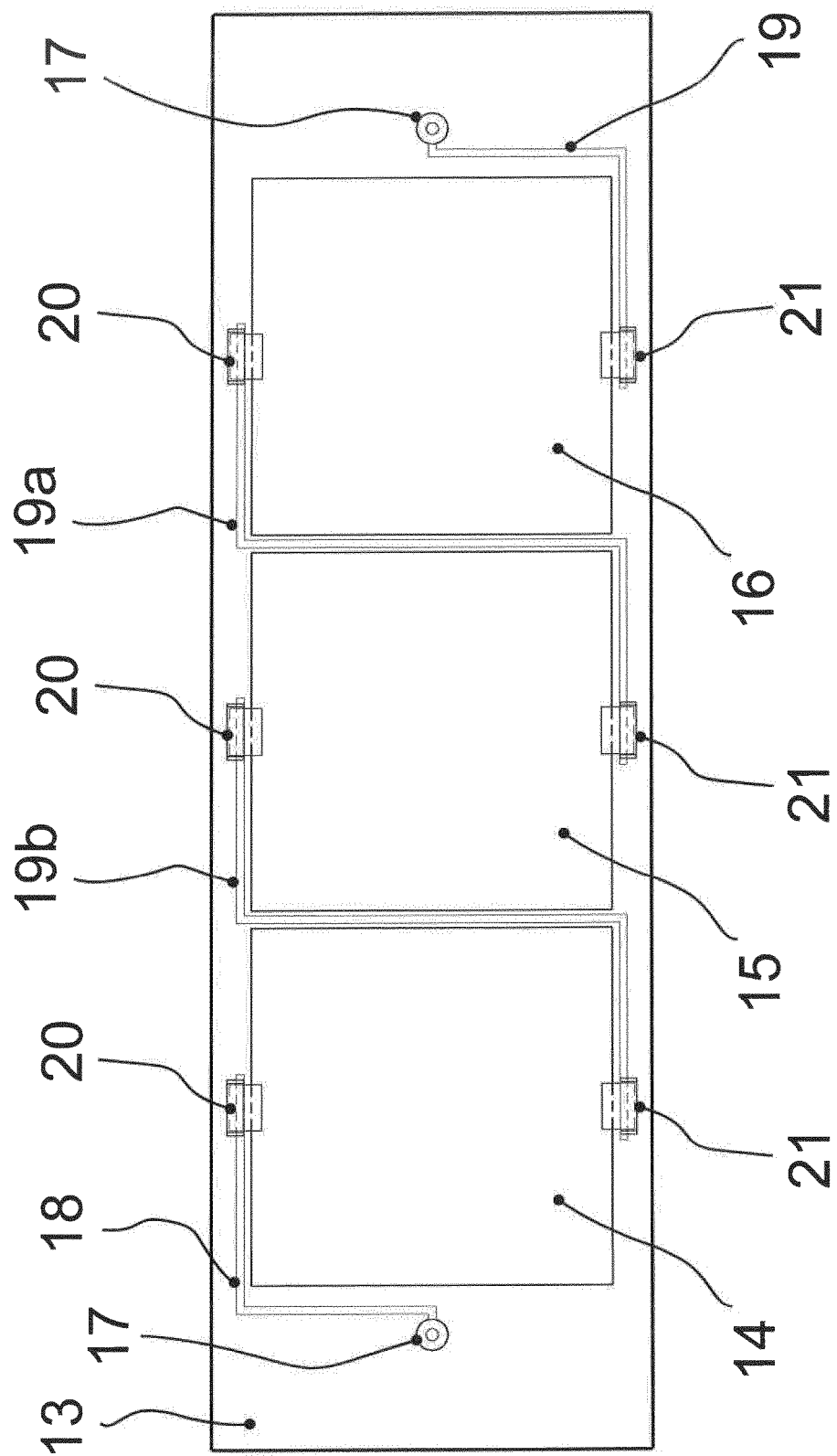

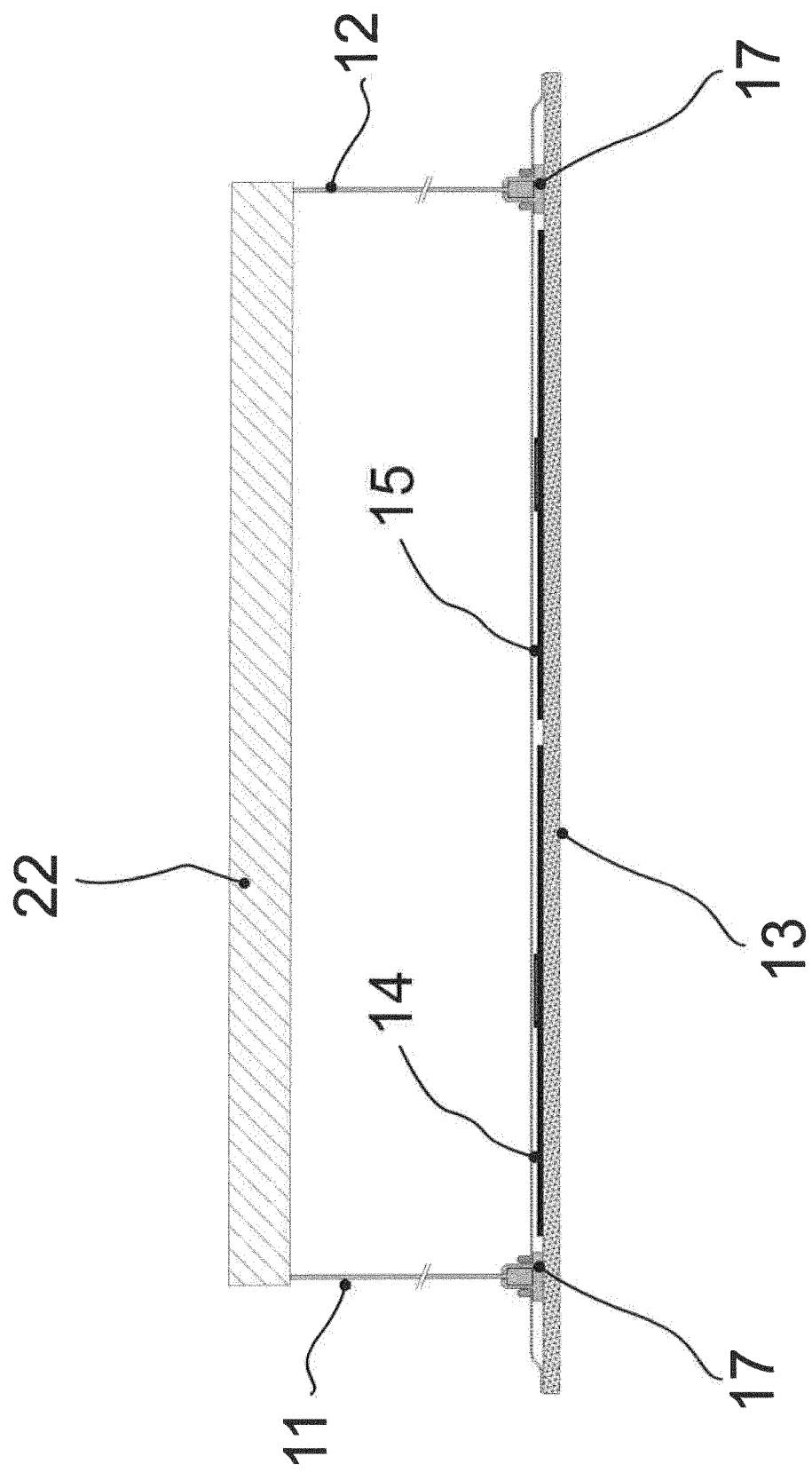

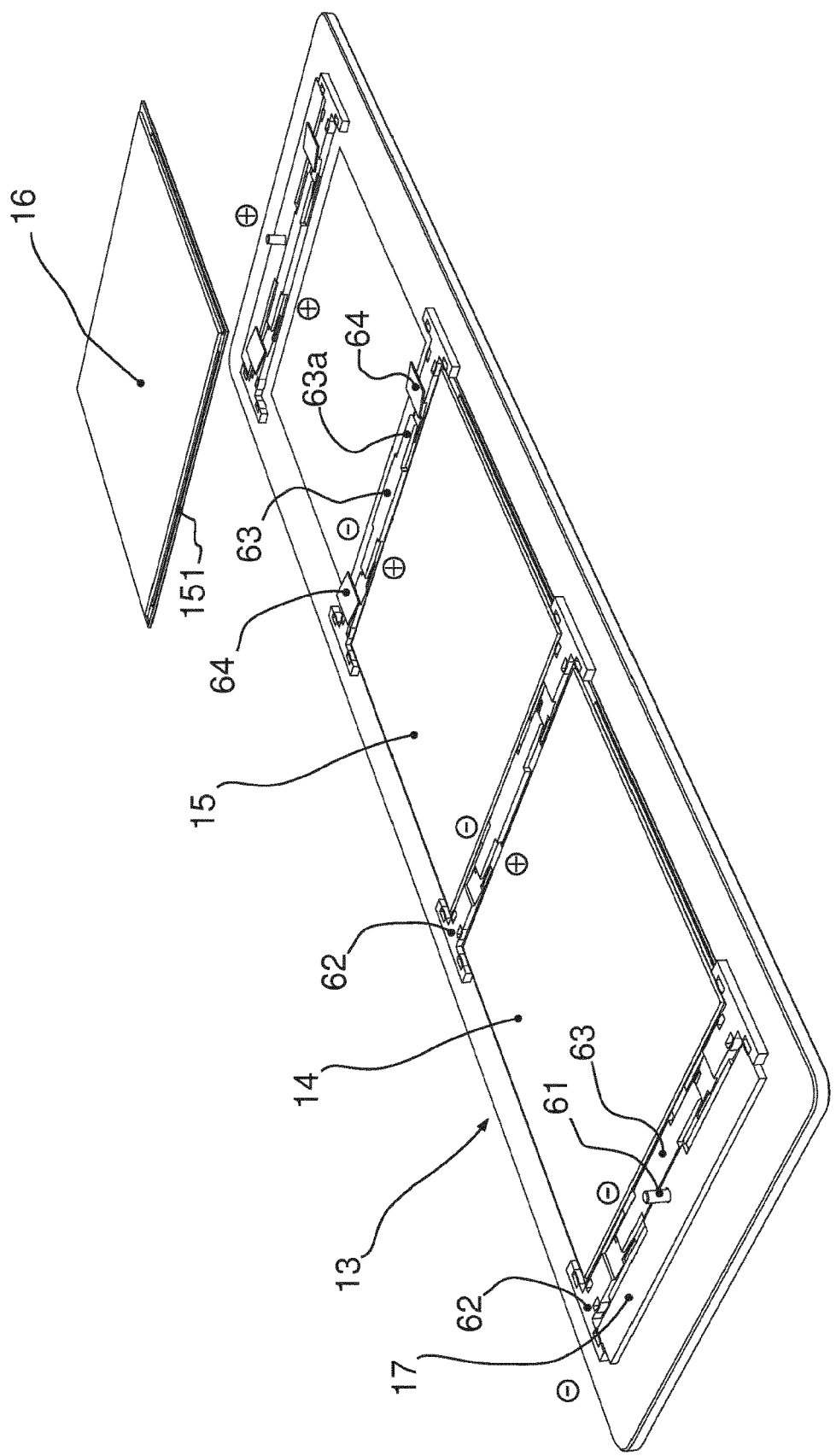

LAMP COMPRISING AT LEAST ONE OLED LIGHTING MEANS

CROSS REFERENCE TO RELATED APPLICATIONS

This application is the U.S. national stage of International Application No. PCT/EP2014/074738, filed on 2014 Nov. 17. The international application claims the priority of DE 102013112694.4 filed on 2013 Nov. 18, the priority of DE 102013114129.3 filed on 2013 Dec. 16 and the priority of DE 102014106799.1 filed on 2014 May 14; all applications are incorporated by reference herein in their entirety.

BACKGROUND

The present invention relates to a lamp comprising at least one OLED lighting means lying flat on an at least partially light-transmissive carrier plate and formed as an OLED panel, wherein at least two contact shoes respectively assigned to an OLED panel are attached onto the rear side of the carrier plate that is facing away from the light-emitting side, and respectively comprise means for contacting one pole each of the OLED panel, and wherein at least one contact shoe has an attachment device, by means of which the OLED panel is attached onto the carrier plate; the attachment device is preferably a clamping device, by means of which the OLED panel is attached in a clamped manner.

Organic LEDs, in what follows designated as OLEDs, have already been of known art for a number of years, and thus far have been predominantly deployed in the display sector. The reason for this lies in the fact that until quite recently the luminous flux outputted by the OLEDs has not been sufficient for general lighting purposes. It has therefore only been possible to deploy OLEDs for supplementary lighting or effect lighting. Moreover, until quite recently the manufacturing costs of the OLEDs were so high that any deployment for general lighting purposes was not economical. In recent times however, ever more effective OLEDs with increasing light output have been developed, and the production costs have steadily reduced.

For example, the company Philips offers two-dimensional OLED panels under the designation "lumiblade GL 350" which, with a size of 124.5×124.5 mm, deliver a luminous flux of 120 lumens of white light, which for example is perfectly sufficient for a table lamp or other applications in the field of living room lighting (see the publication on the Internet under http://www.lighting.philips.de/lightcommunity/trends/oled/lumibladeoledgl350.wpd.)

In the case of OLED panels of the type cited the actual OLED stack is, as a general rule, located on a carrier plate of glass or plastic. If the aim is to integrate such an OLED panel into a lamp, in principle a design solution comes into consideration in which the OLED panel, or a plurality of such OLED panels, is fitted onto a light-transmissive carrier plate. However, here there are still a number of technical problems to be solved, namely on the one hand contacts must be made with the OLED panel in order to supply the latter with power, and on the other hand, the OLEDs must be securely attached onto the carrier plate. Finally, light technology measures are on occasion required, which ensure an effective coupling-out of the light of the light emitted by the OLEDs, and a uniform light distribution over the light-radiating area of the carrier plate.

From DE 10 2010 038 251 A1 an OLED lighting means in the form of an OLED panel has become of known art, together with a lamp that has a plurality of the said OLED panels in a matrix-type arrangement with rows and columns. A plurality of contacts is assigned to each of the OLED lighting means to provide the electrical contacts for the respective lighting means. The lamp has a housing with a frame, which borders the edges of the OLED panel on the front side, and with a housing rear wall, in which the contacts are also held. The housing rear wall consists of a plastic that is not light transmissive, since the intention is for light emission to take place only on the front side via the illuminated area bordered by the frame. Moreover, on the rear side of the housing rear wall a socket is fitted, via which the lamp can be connected to supply cables. In the case of the said lamp of known art the OLED panel is thus located between the front side frame and the rear wall that is not light transmissive. Since each OLED panel on the light emission side has a frame bordering its illuminated area, in a matrix-type arrangement of a plurality of such lighting means the whole light-emitting surface of the lamp is interrupted by the respective webs between the rows and columns of the frame of the lighting means. While it is true that a total illuminated area is created, in that a plurality of lighting means of the same type are arranged next to one another, each lighting means remains a separate unit, and there is no common carrier plate on which the plurality of lighting means are located.

In DE 10 2011 077 687 A1, a module (a lamp) is described with a plurality of OLED panels arranged in the form of a matrix in a plurality of rows, in which a contact structure is arranged centrally between two OLED panels located next to one another. The OLED panels can be eight-sided or four-sided in outline. Contact regions along facing edges of adjacent OLED panels can be connected in an electrically conducting manner via a spring of the central contact structure. Each OLED panel has its own substrate, which serves as a carrier for the first electrode layer, and the sequence of organic layers with the emitter layer and the second electrode layer, wherein in professional circles the said sequence of layers is generally designated as an OLED stack. The functional layers of each OLED panel are covered on their upper side by a glass plate serving to provide encapsulation. The said encapsulated surface on the upper side is that surface of the OLED panel from which light emission takes place. If one thus views the substrate as a carrier plate for the individual OLED panel, then the said carrier plate is located on the rear side of the OLED panel, which is located opposite to the side emitting the light. Even in the case of OLED panels that are closely adjacent, moreover, the carrier plates of the OLED panels are separate from one another, since each OLED panel takes the form of an autonomous unit, which represents a lighting means for the lamp. If a plurality of rectangular OLED panels are arranged next to one another in rows in the form of a matrix, a base frame is on the one hand provided with recesses as additional mechanical holding devices, and a top frame is arranged on the base frame, and mechanically connected with the latter. The top frame has cruciform webs, which cover the contact structures located centrally between the adjacent OLED panels. In overall terms, a light emission surface is thus created, which is subdivided by the webs of the base frame and top frame in the longitudinal and transverse directions. In the variants described in the said document, in which eight-sided OLED panel modules are arranged in rows, the latter are connected with one another in their edge regions by means of, for example, rod-shaped connecting elements and eyelets. Thus here no common carrier plate is provided, on which a plurality of OLED panels is fitted, and which serves as a supporting structure for the latter.

In US 2013/0076229 A1 a two-dimensional panel-type OLED lighting means module is described, together with a lamp comprising the said OLED lighting means module. In addition to the actual light-emitting module with the OLED layers, the OLED lighting means comprises a multi-part attachment part. In front of the OLED panel a transparent covering is located on the light-emitting side, while on the rear side is located a housing made of a non-transparent material, which also holds the front side cover. The closed housing prevents any light emission from the rear side of the module. The light-emitting module is bordered by a comparatively wide rectangular frame, which reduces the light-emitting area. The contacts with the OLED stack are also made via the frame. In the said OLED lighting means module measures are taken in order to deflect light emitted from the light-emitting module into the transparent covering in its edge region, by means of scattering or reflection, back into the transparent plate, so as to achieve a certain illumination also in the edge region by this means. While it is true that here a loss of light as a result of total reflection in the projecting edge region of the transparent plate is prevented, the effective surface area of that part of the OLED that is emitting light with sufficient luminous intensity remains the same. In the document no technical solution is described as to how one, if required, combines a plurality of the said OLED lighting means modules with one another to form a lamp. Since the lighting means modules have comparatively wide peripheral edges, one would not achieve any continuous illuminated area by arranging them in rows. If one were to view the lower transparent covering of the OLED lighting means module as a carrier plate for the module, the said carrier plate would be assigned only to a single lighting means, wherein the side walls of the rear side housing significantly overlap the carrier plate. In this solution of known art a continuous carrier plate for a plurality of lighting means modules is neither provided, nor is possible in any technically logical manner.

From DE 10 2006 054 584 A1 an item of storage furniture is of known art, with a storage surface that comprises a two-dimensionally shaped radiation-emitting component in the form of a plate-form OLED. Fundamentally, therefore, from this document it is of known art to illuminate two-dimensional plate-form regions of an item of furniture by means of OLED panels. However, the said document contains no statements as to how one places a plurality of OLED panels into a storage surface. Since at the present time the largest OLED panels of the latest generation that can be obtained commercially have a size of 120 mm×120 mm, with the use of only one OLED it is only possible to illuminate a comparatively small storage surface of an item of furniture.

In DE 10 2004 026 730 A1 it is proposed to illuminate flexible film-type surfaces with the aid of LEDs, or also OLEDs. Here, for example, a transparent film is suspended in a frame system. Point-form light-emitting diodes are respectively introduced into the film, spaced apart from one another in a matrix-type arrangement, wherein the contacts are made by means of wires, running horizontally and vertically, that cross each other. With such an arrangement one does not obtain uniform two-dimensional light radiation, but rather the impression of multiple points of light. In the said document the examples do not contain any forms of embodiment by means of which a plurality of two-dimensional OLED panels are combined with one another so as to create a uniform illuminated area.

DE 10 2011 079 014 A1 describes lighting modules in the form of two-dimensional OLED panels. In the said document, it is also stated that one can create a two-dimensional illumination arrangement from a plurality of such lighting modules, wherein the individual lighting modules are electrically connected with one another via electrical connections, either in series or in parallel. Here the OLED panel has a structure with an active element, which contains the light-emitting OLED stack, and is held in the form of a sandwich between two plates, namely a carrier plate and a plate serving to provide encapsulation. Both the carrier plate, and also the encapsulation substrate can consist of a light-transmissive material, for example, glass or plastic. In this document the fundamental problem of conventional OLED panels has been recognised, namely that these have a frame bordering the light-emitting surface, as a result of which the surface area of effective light emission is restricted. In order to be able to design a narrower frame it is proposed to arrange the conducting tracks, which form the electrical connections for making contact with the OLEDs, externally on the periphery on the end faces of the panel. With the narrower frames the proportion of non-illuminating surfaces and intermediate spaces between the panels in a combination of a plurality of OLED panels is indeed reduced, but the fundamental problem of interruptions caused by non-illuminating strips remains. The said document does not disclose any practical solution as to how, by combining a plurality of OLED panels, a continuous illuminated area is created in a lamp. Just an individual OLED panel is shown in each case, which represents only one "lighting means". Even if the individual lighting means here has a transparent carrier plate, this carrier plate is only assigned to the said lighting means, with the encapsulation plate connected securely to a non-detachable unit. If one were to release the connection between carrier plate and encapsulation plate of such an OLED panel, the active OLED layer would be exposed to the atmosphere, and would be impaired in its function and service life by moisture and atmospheric oxygen. The individual OLED panel with the sandwich-type arrangement of two plates, which surround the active light-emitting layer, is thus an autonomous unit that cannot be disassembled, a fact that the designer of a lamp, in which such OLED panels are used as lighting means, must take into consideration. If one thus uses a plurality of OLED panels of this type in a lamp, each OLED panel has its own carrier plate, wherein the total material thickness of a commercial OLED panel with a sandwich-type construction of the type cited above is, for example, approx. 1.8 mm.

In DE 10 2006 015 437 A1 a lighting tile is described, which has at least one OLED as a lighting means. The lighting tile has a layered construction with a carrier plate on its rear side, a visual effect plate on its front side, via which the light is emitted, and an intermediate space between the two plates, which accommodates the OLED layers, and is sealed against the environment. Furthermore, an electrical connection is provided on the rear side of the lighting tile in order to make contact with the OLED. While it is stated in the document that in principle a plurality of OLEDs can be used in one lighting tile, no practical technical solution is shown as to how this idea is implemented. The carrier plate on which the OLED layers are fitted is here the rear-side non-transparent plate of the lighting tile. If one were to arrange a plurality of such lighting tiles next to one another, the result would once again be non-illuminated surfaces between the tiles, since here too the effective light-emitting surface area is smaller by some margin than the surface area of the lighting tile in total.

A further OLED lighting means is described in DE 10 2011 107 642 A1. This has a visible side carrier plate made of glass, via the surface of which the light is emitted. The OLED layers are fitted onto the rear side of the carrier plate, wherein a cover plate is located behind the carrier plate, such that the OLED layers lie between carrier plate and cover plate. Furthermore, a plate-form cooling body is located behind the carrier plate, via which cooling body the heat is to be removed. The whole arrangement is surrounded by a housing of an insulating material, in which are also held angled contacts with two arms, of which one arm makes contact with a metallic layer in the edge region of the carrier plate. By virtue of the non-transparent cooling body light emission is only possible on one side. The insulating material body forms a comparatively wide frame, which surrounds the light-emitting surface of the OLED lighting means peripherally on all sides, so that in the event of a combination of a plurality of OLED lighting means of this type no continuous illuminated area can be created. This document also does not give any suggestion as to how to create a lamp using a plurality of OLED lighting means of this type. Here a solution is just presented for mounting and making contact with a carrier plate layered with an OLED stack. The result of this is once more an individual OLED lighting means, wherein here an individual solution for a further OLED lighting means is described.

However, in the marketplace there are OLED panels of known art of a small number of leading suppliers of lighting means, which have prescribed design features for contacts, mounting, etc., such that it is advantageous for the lamp designer, when designing a lamp on the basis of OLED lighting means, to take into consideration the subject matter of these commercially available OLED lighting means, instead of generating a further individual OLED lighting means.

SUMMARY

The present invention relates to a lamp comprising at least one OLED lighting means lying flat on an at least partially light-transmissive carrier plate (13) and formed as an OLED panel (14, 15, 16), in which at least two contact shoes respectively assigned to an OLED panel are attached on the rear side of the carrier plate that is facing away from the light-emitting side and respectively comprise means for contacting one pole each of the OLED panel. The solution according to the invention provides a lamp that ensures effective coupling out of the light emitted by the OLEDs and uniform distribution of the light over the light-radiating area of the carrier plate and at the same time is of a comparatively simple construction and an attractive design. The lamp according to the invention may for example be a pendant lamp, a suspended lamp, a surface-mounted ceiling lamp, a recessed ceiling lamp, a standard lamp or a table lamp.

DETAILED DESCRIPTION

The task of the present invention consists in creating a lamp using OLED panels as lighting means, with the features of the generic type cited in the introduction, which has at least one continuous illuminated area without interruptions with broadly uniform light emission over the illuminated area, wherein the dimensions of the illuminated area are not limited to the dimensions of an individual OLED lighting means.

Furthermore, it is a concern of the present invention to create a lamp that in design terms it is comparatively simple to construct, has an attractive design, and satisfies the above-cited technical requirements.

The solution of the above-cited task delivers a lamp, comprising at least one OLED lighting means of the generic type cited in the introduction, lying flat on an at least partially light-transmissive carrier plate, and formed as an OLED panel, with the features of claim 1.

In accordance with the invention two or a plurality of OLED panels arranged, for example, in series, respectively, are arranged on the rear side of the at least partially light-transmissive carrier plate, facing away from the light-emitting side, and at least one contact flange is attached on or to the carrier plate, which is in conducting contact with a conducting track fitted onto the carrier plate, which leads from the contact flange to one or a plurality of contact shoes, respectively assigned to the OLED panels.

The at least two contact shoes, respectively assigned to an OLED panel, are attached on the rear side of the carrier plate facing away from the light-emitting side, and respectively comprise means for contacting one pole respectively of the OLED panel. One such contact shoe can be connected in a conducting manner with the minus pole of the OLED and the other with the plus pole of the OLED, wherein the contact shoes can be supplied with voltage via a suitable electrical connection.

At least one contact shoe has an attachment device, by means of which the OLED panel is attached onto the carrier plate, preferably a clamping device, by means of which the OLED panel is attached in a clamped manner. In this manner the contact shoes can be utilised with a dual function, namely on the one hand for the electrical supply to the OLED panels, and on the other for the attachment of the OLED panels to the carrier plate. This solution is simple and effective in design terms and enables efficient production of such an OLED lamp.

In accordance with a further development of the invention contact can be made, for example, via a plate-form element of the contact shoe, such as, for example, a printed circuit board, or similar, with one pole respectively of the OLED. For the electrical supply to the contact shoes, which are located on the OLED panels, it is possible, for example, to use conducting tracks that are printed onto the carrier plate, wherein the technology of printed conducting tracks is of known art per se from other sectors of lighting technology.

In accordance with a further development of the invention it is advantageous if for each OLED panel a constant current source, or a current limiter is respectively provided; the constant current source or current limiter is assigned to the OLED panel. In this variant it is possible to lead a common supply cable, coming respectively from a plus pole and a minus pole of a voltage source, to a contact element on the carrier plate of the lamp, and then from the latter to branch off, for example, the respective conducting tracks to the OLED panels connected in parallel, wherein in each feeder cable the constant current source, or current limiter, is respectively connected upstream of the OLED panel. By this means the OLED panel is protected from currents that are too high, but a total of only two cables needs to be led respectively from the plus pole and minus pole of the voltage source as far as the carrier plate. If, on the other hand one wished to lead two cables from the voltage source to each OLED panel respectively, one would require too many cables and there is insufficient space available for such a cable harness in the region of the supply in the case of a lamp of the inventive type.

In accordance with a further development of the invention a monitoring electronics circuit is preferably provided for each OLED panel. Such a monitoring electronics circuit can, for example, be arranged in the conducting path between the constant current source, or current limiter, and the contacts of the OLED panel. In accordance with a variant of design embodiment of the invention the monitoring electronics circuit can comprise, for example, a circuit for purposes of monitoring the forward bias of the OLED, and/or a trip delay, and/or a bypass thyristor.

In design terms, one can, for example, solve the problem of making contact with the OLED panels by leading the supply cable from the plus pole of the voltage source to a first contact flange, which is attached on or to the carrier plate and which is in conducting contact with a first conducting track applied onto the carrier plate, and by attaching a second contact flange on or to the carrier plate, which is in conducting contact with a second conducting track, applied onto the carrier plate, and coming from a minus pole of the voltage source, wherein for each OLED panel connected in parallel a feeder cable in the form of a conducting track, connected respectively with the first conducting track and with the second conducting track, is led firstly to a constant current source, or current limiter, assigned to the said OLED panel, and from the latter two conducting tracks respectively lead to the two contacts of the OLED panel.

A further problem with such lamps with OLED panels lies in the fact that when more or less transparent or translucent carrier plates are being used as supports for the OLED panels, it may be possible for the attachment elements, together with the elements for making contact with the OLEDs on the light-emitting side, to be seen through the carrier plate, which impairs the aesthetic appearance of the lamp. For this reason frame elements, for example, of metal or plastic, are mostly used in the solutions of known art so as to conceal the said attachment elements and contact elements of the OLED panel. Such frame elements lead, however, to a more complex structure for the lamp, require additional assembly activity by the manufacturer, and sometimes also increase the structural height and the overall dimensions of the lamp, as a result of which the particular advantage of the flatness of the OLED panel is once again partially lost.

For this reason a further development of the present invention envisages that the cited attachment elements and contact elements are concealed with comparatively simple means in design terms, wherein a low structural height of the lamp can once more be achieved. For this purpose the carrier plate, on the rear side facing away from the light-emitting side, is coated, pasted, matted, or printed in those particular sub-regions in which attachment elements, in particular for the suspension or mounting of the lamp, and/or contact elements for the OLED panel, and/or conducting tracks, are located. The electronic components such as the constant current source, current limiter, monitoring electronic circuit, etc., can also be concealed in this manner by printing, coating, etc. of the carrier plate.

A particularly advantageous further development of the invention envisages that the carrier plate, on the rear side facing away from the light-emitting side, is two-dimensionally printed, coated, pasted, or matted with at least one layer in the form of a frame, wherein the said printing, pasting, matting or coating omits the light-emitting surfaces on which the one or more OLED panels are fitted.

Within the context of the invention, at least one printing, pasting, or coating with ceramic pigments, or another electrically insulating coloured material, preferably takes place, as a result of which the rear side of the carrier plate thus printed is once again electrically insulating, and conducting tracks of an electrically conducting pigment can subsequently thus be printed or pasted onto the thus printed carrier plate; these serve the purpose of making the electrical connections to the OLED panels.

Furthermore, in accordance with a further development of the invention at least one printing, pasting, or coating preferably takes place with light, in particular approximately white, pigments or dyes. One can also print, paste, matt, or coat the rear side of the carrier plate in a plurality of successive printing processes, preferably congruently in each case, for example, at least twice, in each case with light, in particular, for example, white pigments, or dyes.

A particularly preferred variant of the present invention envisages that the rear side of the carrier plate is printed, pasted, or coated in two or a plurality of successive printing processes, in each case with different colours of pigments or dyes, preferably in each case congruently, and in the form of a frame, in each case omitting those surfaces on which the light-emitting surfaces of the OLED panels are later arranged. For example, a double, triple or multiple printing, pasting, or coating can, for example, be applied to the same (congruent) surfaces, wherein at least one printing, pasting or coating takes place with a light, in particular white, pigment or dye, and furthermore, preferably afterwards, at least one printing, pasting or coating takes place with a dark, in particular a grey or black, pigment or dye. With this kind of double or multiple printing, pasting, matting or coating a better coverage of the carrier plate is achieved so as to prevent transparency from the front side (the light-emitting side) into the printed/coated/pasted/matted surface regions, as is a higher contrast.

On the rear side facing away from the light-emitting side, and/or also on the light-emitting side of the carrier plate, one can also at least partially provide, for example, printing, pasting, matting, coating, embossing, or engraving in surface regions that comprise the edge regions of the light-emitting surface of the OLED panel, and in regions bordering on the latter. In this manner one can achieve a more uniform light distribution on the light emission side, since the transitions from light to dark become less sharp (softer) in these surface regions when the OLED is switched on.

What is also advantageous in an inventive lamp is the fact that the latter manages with very few functional components, and the type of lighting means and the printing of the carrier plate, by means of which the lighting means are bordered in a quasi-frameless manner, enable an extremely flat construction of the lamp. It is possible, for example, to use a thin carrier plate of glass or a transparent plastic, on which are fitted directly the very flat OLED panels, which have a material thickness that is, for example, only in the 1 to 2 mm range. The printing, pasting or coating applies only a negligible thickness, since even in the case of multiple printings, pastings or coatings, the thickness can be, for example, in the µm-range.

If required, the side of the carrier plate facing away from the light-emitting side is covered by means of a plate-form covering, if this is desirable, for example for visual reasons. Such a covering can, for example, consist of metal or other suitable materials, such as glass, plastic, paper, leather or composite materials made from combinations of the above-cited materials, and the covering can be fitted with a small spacing apart from the carrier plate, and can also be very thin, such that the overall build height of the lamp is not increased significantly.

If conducting tracks are applied onto the carrier plate for purposes of making contact with the OLED panels, at least one contact shoe can, for example, be soldered or brazed or adhesively bonded onto a conducting track, thus making a conducting connection.

Further conducting tracks can also be applied onto the carrier plate, so that additional electronic components such as, for example, drivers, sensors etc., can be soldered or brazed or adhesively bonded onto the said further conducting tracks. These electronic components can, for example, have a particular function for a switching surface of the lamp. For example, on-off switches or dimmer switches can be provided, which are preferably actuated by means of touch-sensitive capacitive elements or proximity sensors. Here the aim is to create a nearly invisible region as the interface. By touching or approaching the said switching surfaces it is possible for example, to dim, and/or switch on and off, the brightness of the OLED panel. One can therefore, for example, create a type of printed circuit board that is printed onto the carrier plate. The electronic components cited can also be concealed by means of the above-cited printing, pasting, matting, or coating, so that they are not visible to the observer on the light-emitting side of the carrier plate.

At the ends of the conducting tracks facing away from the OLED panels, at least one contact flange can be attached on or to the carrier plate, which is in conducting contact with a conducting track applied onto the carrier plate, which conducting track leads from the contact flange to one or a plurality of contact shoes respectively assigned to the OLED panels. Such a contact flange, which is in conducting contact with at least one conducting track applied onto the carrier plate, can be arranged in the region of the suspension fitting or attachment of the lamp. In these exemplary design variants of embodiment of such a lamp, the electrical supply thus takes place in the first instance, for example, from a power supply assigned to the lamp, via the attachment to the contact flanges, and from the latter, via the conducting tracks to the contact shoes, which in turn make contact with the OLED panels. It is particularly advantageous if here components, which serve to provide the attachment to the lamp, the carrier plate, and the OLED panels, are used, so to speak, in an additional function to supply the OLEDs with voltage.

At least the surface of the light-transmissive carrier plate facing towards the OLED panel preferably consists of glass or a transparent plastic, in particular an acrylic glass, and a carrier layer of the OLED panel, facing towards the light-transmissive carrier plate, and to be detachably connected with the latter, preferably also consists of glass or a transparent plastic, in particular an acrylic glass.

In accordance with a preferred further development of the inventive task, the light-transmissive carrier plate, on which one or a plurality of OLED panels are fitted, is part of a pendant lamp, a suspended lamp, a surface-mounted ceiling lamp, a recessed ceiling lamp, a standard lamp, or a table lamp. The rear side of the carrier plate, facing away from the light-emitting side, in accordance with the above definition, is, for example, the upper side of the carrier plate in the case of a pendant lamp. In accordance with the invention in the case of a pendant lamp, one or a plurality of OLED panels are thus arranged on the upper side of the at least partially light-transmissive carrier plate.

Further alternative variants of the inventive lamps can be, for example, recessed floor lamps, mirror lamps, furniture lamps or illuminable furniture elements, mobile lamps, external lamps, street lamps, orientation lamps, information lamps, or lamps for emergency lighting. Further possible applications for the inventive lamps are found, for example, in the field of signalling devices (for example, traffic lights), as displays for facade elements, as devices installed in motor vehicles, rail vehicles, ships, aircraft, or similar.

The voltage supply in the case of such a pendant lamp can take place, for example, via the suspension fitting of the lamp, which at its lower end is mechanically connected with the carrier plate. From there one can, for example, make an electrically conducting connection with a conducting track via a contact flange of the suspension fitting, which conducting track can in turn be printed onto the glass or acrylic glass of the carrier plate, and is led from the contact flange of the suspension fitting to one of the above-cited contact shoes, which in turn makes contact with the OLED panel.

In accordance with a preferred further development of the invention, the carrier plate on its light-emitting side is matted in at least sub-regions, in particular by means of etching, sandblasting, grinding, lasering, or similar. By this means one can achieve a more uniform light distribution. The light is then not only radiated in the regions exactly corresponding to the illuminated areas of the OLED panel, and the discrete outlines of the illuminated areas are not perceived by the observer in a more or less pronounced manner. With the use of a plurality of OLED panels it is possible for virtually the whole surface of the carrier plate to radiate light on its light-emitting side.

On the rear side facing away from the light-radiating side the carrier plate can, for example, be coated, or printed at least in sub-regions, so as to modify the light radiation characteristics or the colour of the light, or, for example, so as to achieve light emission or modified light emission only in selected surface regions. Such a coating can be partially light transmissive, and its application can take place by means of printing, for example, by means of screen printing or digital printing, or other suitable printing processes.

As an alternative to this, coating can take place by means of one of the methods of current known art in the prior art for the application of thin layers, for example by means of vacuum coating, evaporation (PVD), sputtering, plasma coating, vapour deposition (CVD), sol-gel deposition, spin coating, roller application, spraying, dip coating, etc.

One can, for example, achieve selective light scattering from the carrier plate in particular surface regions by means of printing, lasering, sandblasting, grinding, milling, etching, or similar of the carrier plate on its light-emitting side, so as there to effect an increased coupling-out of the light, or, for example, to effect a more uniform coupling-out of the light in the edge regions of the OLED panels. A coating of the carrier plate on the side facing away from the light emission can take place partially, or over the full surface, also, for example, for the application of a mirror coating.

By means of the printing or coating one can ensure that in the switched-off state the region or regions, in which the visible light emission surface of the OLED panels is/are located, differ only a little in their colour and/or in their appearance from the remaining region of the carrier plate, and one thus obtains a largely homogeneous visible surface in appearance, which ensures an attractive visual appearance for the inventive lamp.

An inventive lamp can have two or a plurality of OLED panels. The OLED panels usually have an approximately rectangular outline, but other outline shapes are also conceivable. If two or a plurality of OLED panels are being used, these can be arranged, for example, in a row, or in a plurality of rows next to one another, wherein as a general rule the OLED panels are arranged on the rear side, facing away from the light-emitting side, of the at least partially light-transmissive carrier plate, and a pole of the said OLED panels arranged in a row can, for example, respectively make contact with a respective common conducting track.

There are also OLED panels with other outline shapes in a very wide range of sizes, such as, for example, round or oval OLED panels with a round, triangular or rectangular light-emission surface. The inventive printing or coating can be adapted to the OLED panel format in question, corresponding to the contour of the light-emitting surface.

The OLED panels can be connected in parallel, or in series. In the last-cited case, conducting tracks respectively connect the various poles of an OLED panel.

In addition to the above-cited applications, further areas of application are conceivable for the inventive lamps. The lamp can be, for example, a lighting shelf, a lighting panel, an electrical appliance, a household appliance, an item of urban furniture, a facade element, a wall element, a ceiling element, an exterior lamp of a motor vehicle, or an installation fitting of a motor vehicle, rail vehicle, ship, or aircraft, or an illuminable part of such a subject item.

The subject matter of the present invention also includes an alternative solution variant in which there are no conducting tracks on the carrier plate. In this variant of a lamp, with the features of the generic type cited in the introduction, two or a plurality of OLED panels likewise arranged, for example, in a row are arranged on the rear side of the at least partially light-transmissive carrier plate, facing away from the light-emitting side, and at least one contact flange is attached on or to the carrier plate, however, the said contact flange is in direct conducting contact with a contact shoe arranged on the carrier plate, which in turn, moreover, makes contact with at least one OLED panel. Here, therefore, no conducting tracks are required between contact flange and contact shoes. The contact flange and at least one contact shoe are located relatively close to one another.

In this variant at least one contact shoe is preferably provided, which makes respective contact with the contact regions of two adjacent OLED panels, wherein in the case of one OLED panel contact is made with the plus pole, and in the other OLED panel with the minus pole. Thus here the OLED panels are connected in series, whereby the current flow can take place from one contact flange of the one pole, in the region of which the supply of power into the lamp can take place, via one contact shoe into a first OLED panel, from this in turn via a further contact shoe into the next OLED panel, etc., up to a further contact flange of the other pole.

In this variant, in accordance with a preferred further development of the invention, at least one contact shoe can in particular be designed in two parts, and can comprise a clamping element that can be fixed onto the carrier plate, and at least one contact element that can be detachably connected with the clamping element, which contact element makes contact with the contact region of the one or more OLED panels.

In this variant of the invention, for example, the OLED panels can have contact regions extending along an edge, for example in the form of a strip or tongue, and at least one contact element, in the assembled state, can press from above onto this contact region, and can thereby make contact with the OLED panel and at the same time can clamp the latter securely onto the carrier plate. Thus the detachable attachment of the OLED panels onto the carrier plate can be achieved at the same time as the establishment of contact with the OLED panel, using comparatively simple technical means. In this manner, for example, the clamping element can be assembled securely on the carrier plate, and the contact element on the one hand can be pushed under a region of the clamping element, and on the other hand can be pushed over the strip-form contact region of the OLED panel.

The features cited in the subordinate claims relate to preferred forms of embodiment of the invention. Further advantages of the invention ensue from the following detailed description.

BRIEF DESCRIPTION OF THE DRAWINGS

In what follows the present invention is elucidated in more detail with the aid of examples of embodiment, with reference to the accompanying figures. Here:

FIG. 3a shows a further schematically simplified plan view of the pendant lamp of FIGS. 1 and 2, in which the OLED panels are connected in series;

FIG. 4 shows a schematically simplified side view of an exemplary inventive pendant lamp;

FIG. 7 shows a perspective view of an exemplary lamp in accordance with a further alternative variant of the present invention;

DETAILED DESCRIPTION OF THE PREFERRED EMBODIMENTS

Figure 1:
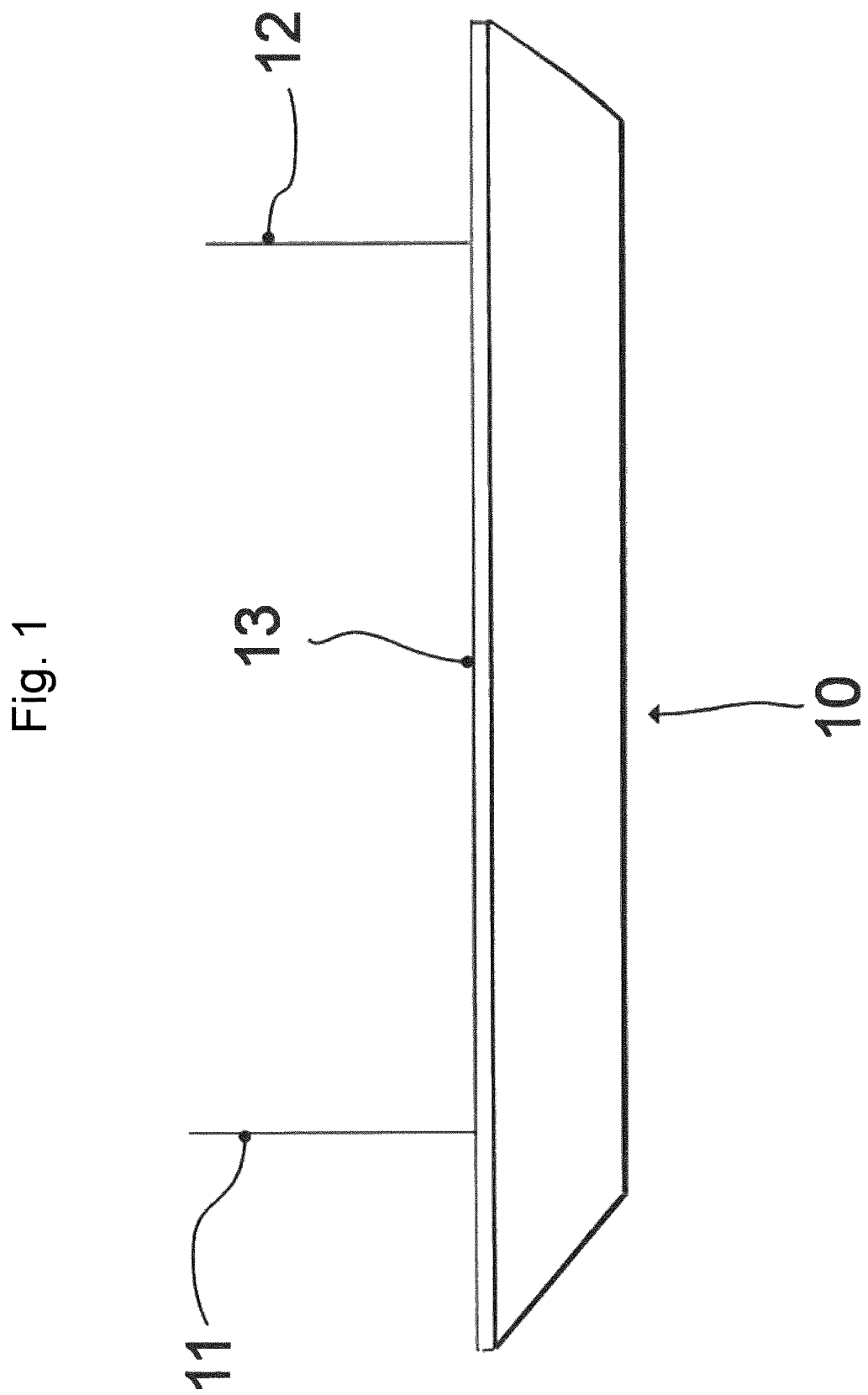
FIG. 1 shows a schematically simplified perspective view of an exemplary inventive pendant lamp viewed obliquely from below.
Figure 2:
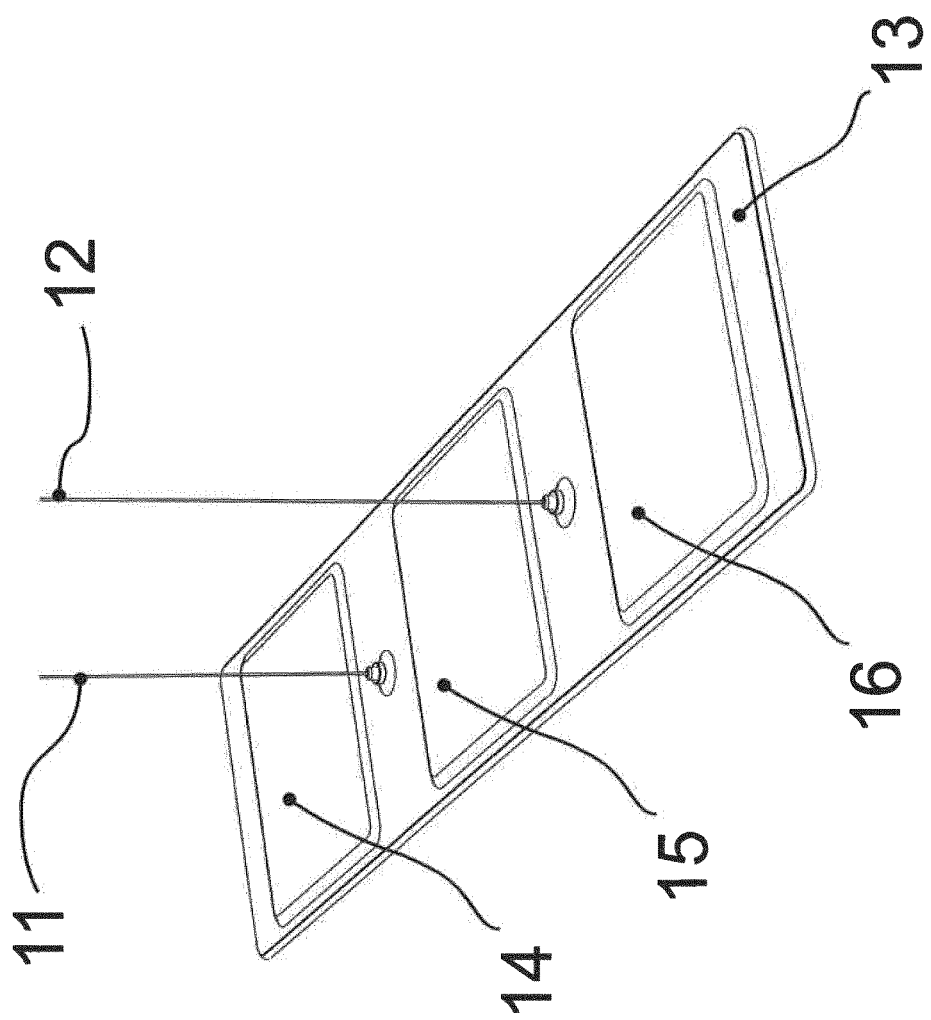
FIG. 2 shows a further schematically simplified perspective view of an exemplary inventive pendant lamp viewed obliquely from above.
Figure 3:
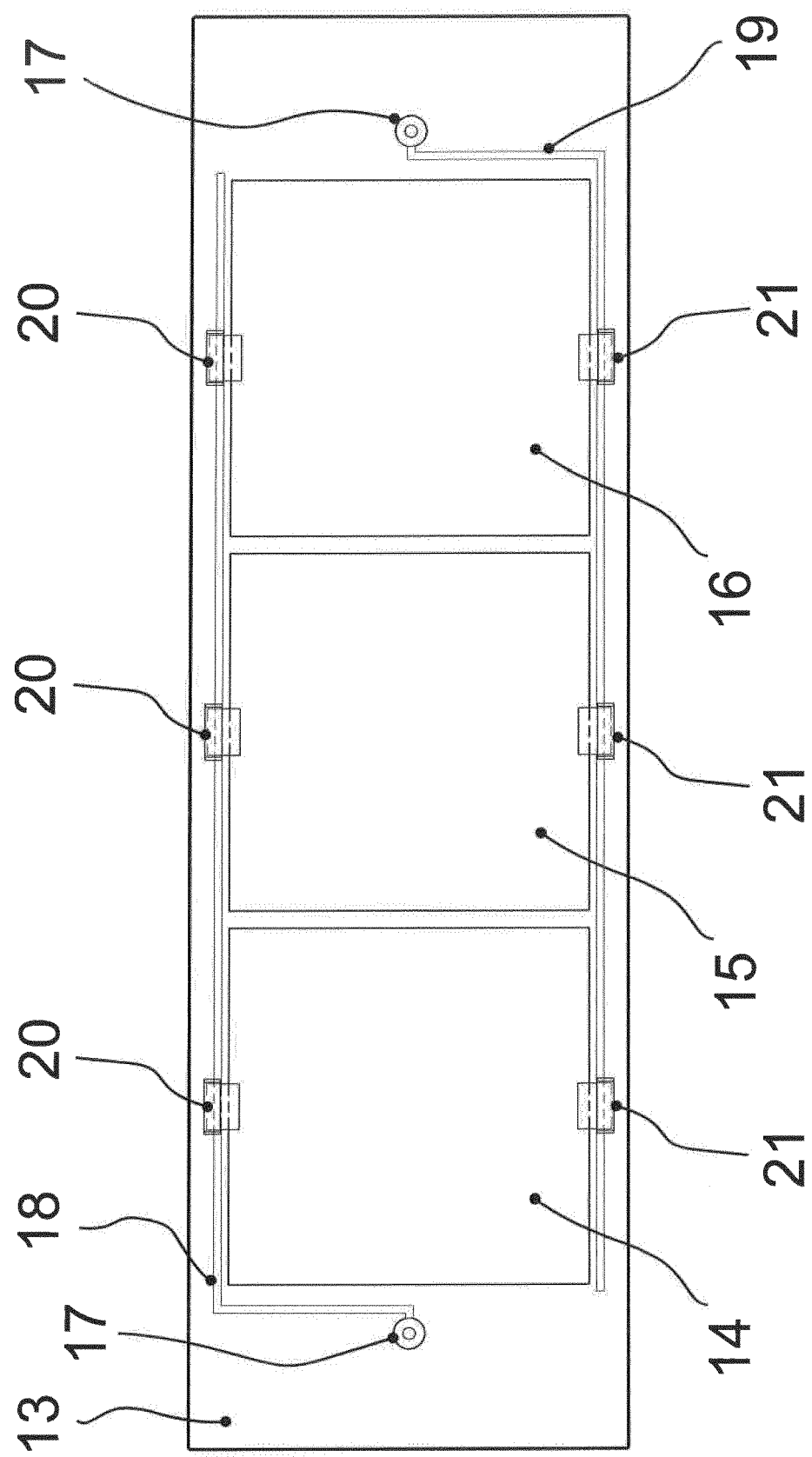
FIG. 3 shows a schematically simplified plan view of an exemplary variant of embodiment of the pendant lamp of FIGS. 1 and 2.

Reference is firstly made to FIGS. 1 to 3, and with the aid of the latter the basic design of an inventive lamp with OLED panels as a lighting means is explained by way of example. The said variant takes the form of a pendant lamp 10, which can be suspended from a ceiling of a room. For this purpose the lamp has two suspension fittings 11, 12, which are spaced apart from one another, which can also be used to accommodate the electrical cables for the power supply to the lamp; this will be explained in more detail in what follows. The lamp comprises a carrier plate 13 with an essentially rectangular outline, such that there are two longitudinal sides and two transverse sides. However, the outline shape can be varied over a wide range, and the elongated rectangular shape is presented here only by way of example.

FIG. 2 shows that a plurality of likewise rectangular, here almost square, OLED panels 14, 15, 16 are fitted onto the upper side of the rectangular carrier plate 13; these are attached onto the carrier plate 13, and are arranged in a row, in each case with a spacing between them, and, as viewed in the longitudinal direction of the carrier plate 13, are arranged next to one another. The number of OLED panels, their outline shape, and their arrangement on the carrier plate, can be varied over a wide range, for example, as a function of the size and outline shape of the carrier plate 13, and also depends on the intended use of the lamp, together with technical lighting parameters such as, for example, the desired illumination characteristics, illumination strength, etc.

FIG. 3 shows a schematically simplified plan view of the pendant lamp in FIGS. 1 and 2, from which one can discern the basic principle of how contact can be made with the OLED panels 14, 15, 16 fitted onto the carrier plate 13. Starting in each case from a contact flange 17, which can be fitted onto the carrier plate 13 in the region of the respective suspension fitting, conducting tracks 18, 19, are provided, which can, for example, be printed onto the carrier plate 13. One conducting track 18 leads from the left-hand contact flange 17 in the figure, which corresponds to the plus pole, respectively to contact shoes 20, of which one is fitted respectively onto each of the three OLED panels 14, 15, 16, and thus makes contact with the plus pole of the respective OLED panel. Correspondingly one conducting track 19 leads from the right-hand contact flange 17 in the figure, which corresponds to the minus pole, respectively to a further contact shoe 21 of each OLED panel, which respectively makes contact with the minus pole of the OLED panel. Thus contact is made by two contact shoes 20, 21 respectively with each of the three OLED panels 14, 15, 16; of these two contact shoes, in each case one corresponds to the plus pole, and one corresponds to the minus pole, wherein the two contact shoes 20, 21 of each OLED panel can, for example, be respectively located on the latter opposite one another, as is represented in the drawing in FIG. 3. By means of only two contact flanges 17, which correspond to the minus pole and plus pole respectively, together with the conducting tracks respectively emanating from the latter, contact can be made with all the OLED panels of the lamp that are fitted onto the carrier plate 13.

In the form of embodiment in FIG. 3 the OLED panels are connected in parallel. FIG. 3a shows a further alternative form of embodiment, in which the OLED panels are connected in series, and the conducting tracks correspondingly run respectively from the contact shoe 21 of the minus pole of the one OLED panel to the contact shoe 20 of the plus pole of the other OLED panel.

Figure 3B:
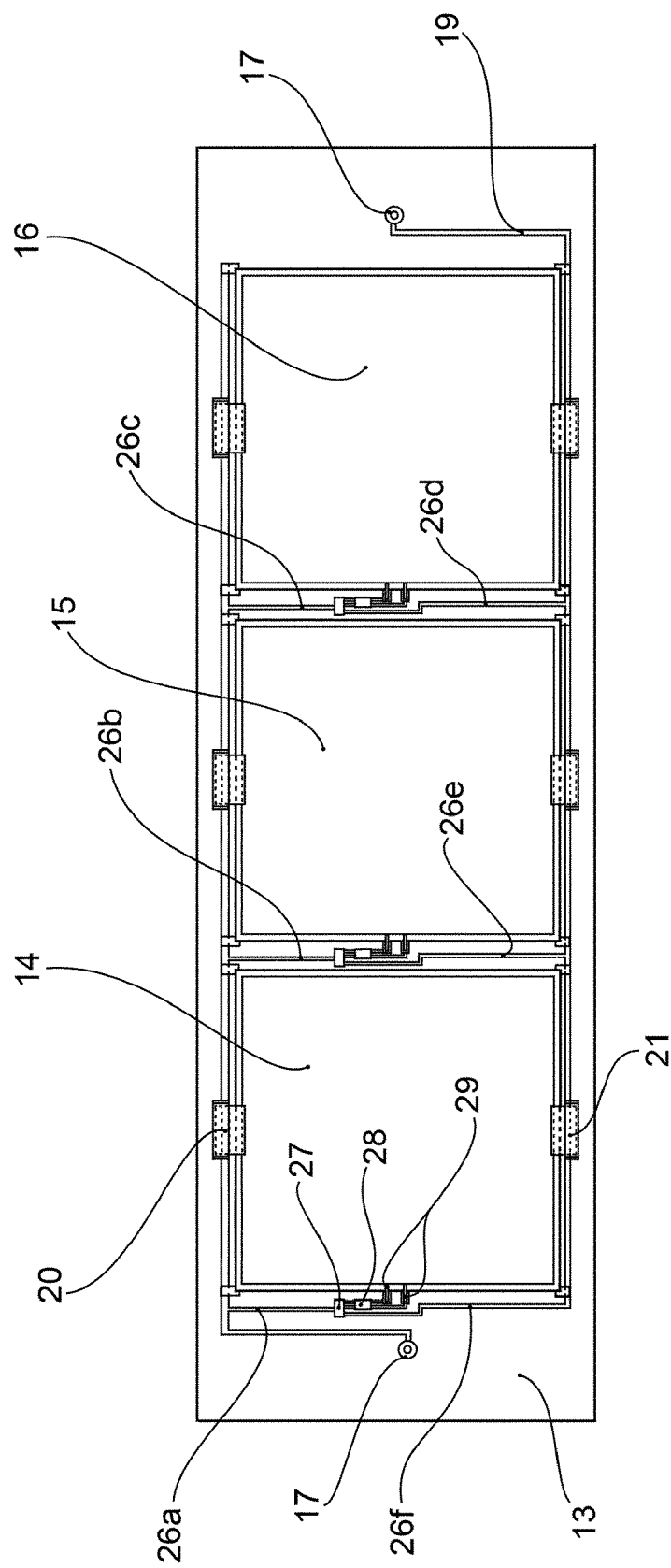
FIG. 3b shows a further schematically simplified plan view onto a variant of an inventive pendant lamp.
Figure 3C:
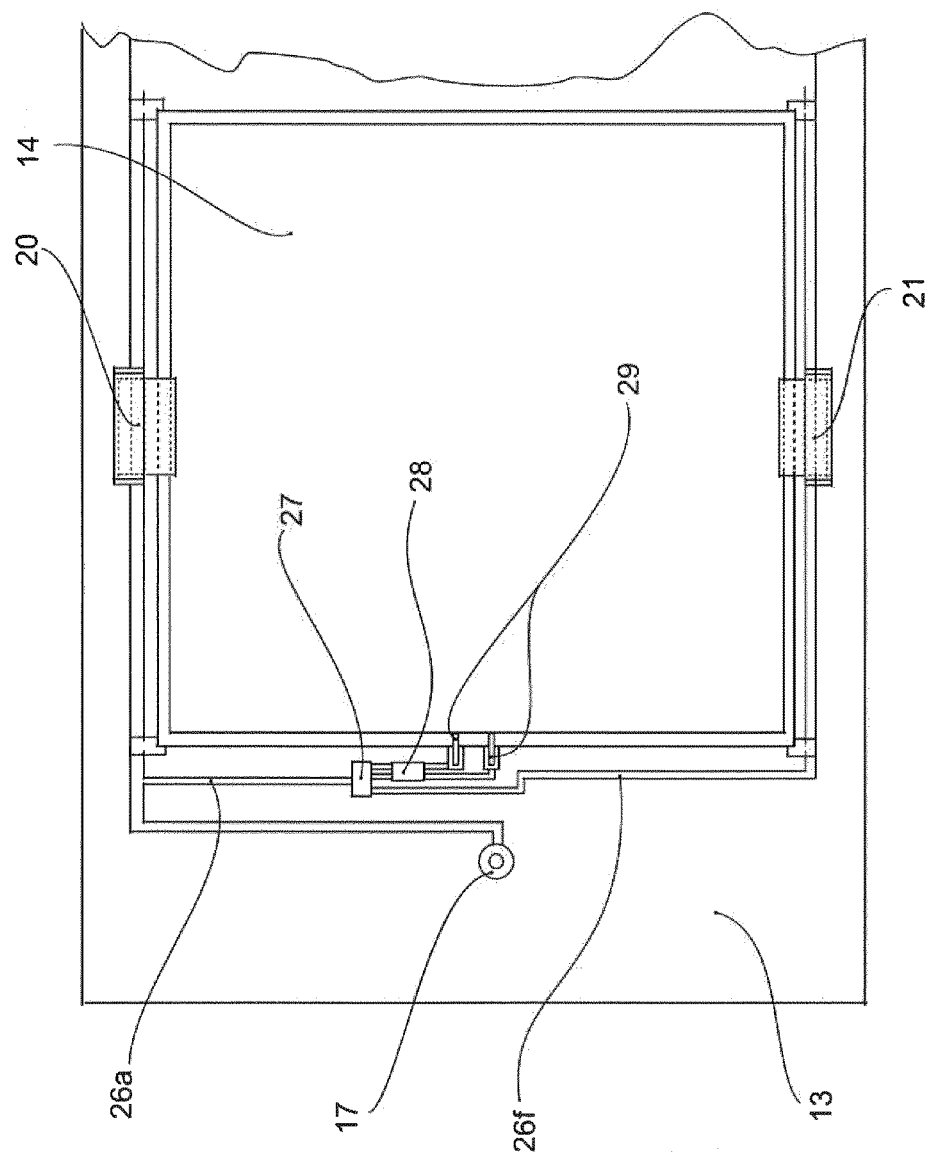
FIG. 3c shows an enlarged detail from the view in FIG. 3b.

FIGS. 3b and 3c show a schematically simplified plan view of an alternative variant of the pendant lamp in FIGS. 1 and 2, from which one can discern a possible principle of how contact can be made with the OLED panels 14, 15, 16 fitted onto the carrier plate 13. Starting in each case from a contact flange 17, which can be applied onto the carrier plate 13 in the region of the respective suspension fitting, conducting tracks 18, 19, are provided, which can, for example, be printed onto the carrier plate 13. One conducting track 18 leads from the left-hand contact flange 17 in the figure, which corresponds to the plus pole, respectively to a plurality of feeder cables 26a, 26b, 26c, of which one leads in each case to one of the three OLED panels 14, 15, 16. In each of the said feeder cables 26a, 26b, 26c a constant current source 27 is respectively connected upstream of the OLED, together with a monitoring electronics circuit 28. Correspondingly a conducting track 19 leads from the right-hand contact flange 17 in the figure, which corresponds to the minus pole, on the carrier plate to the OLED panels, from which three feeder cables 26d, 26e, 26f then branch off in turn, in each case to the constant current source 27 of an OLED panel. The two supply cables for the two poles then lead from each constant current source 27, via the monitoring electronics circuit 28, respectively to the two contacts 29 of the respective OLED panel. In this manner the three OLED panels 14, 15, 16, are connected in parallel, and are supplied with constant power.

Each of the three OLED panels 14, 15, 16 is respectively detachably attached onto the carrier plate 13 by two clamping devices 20, 21, located, for example, approximately opposite one another, as is represented in the drawing of FIG. 3. By means of only two contact flanges 17, which correspond to the minus pole and plus pole respectively, together with the conducting tracks emanating from the latter in each case, contact can be made with all the OLED panels of the lamp, connected in parallel, that are fitted onto the carrier plate 13.

In the case of a pendant lamp as represented in FIG. 4, the voltage supply to the contact flanges 17 can again take place via the suspension fittings 11, 12 of the lamp. For this purpose, for example, starting from an electronic power supply unit 22, a supply cable is led in each case through each of the two suspension fittings 11, 12; at its lower end, in each case facing towards the carrier plate 13 in the region of the respective contact flange 17, electrical contact is then made respectively with the conducting tracks 18, 19 that are applied onto the carrier plate. In the example according to FIG. 4, only two OLED panels 14, 15 are arranged on the carrier plate; the structure of the ceiling pendant light otherwise essentially corresponds to that in FIG. 3.

Figure 5:
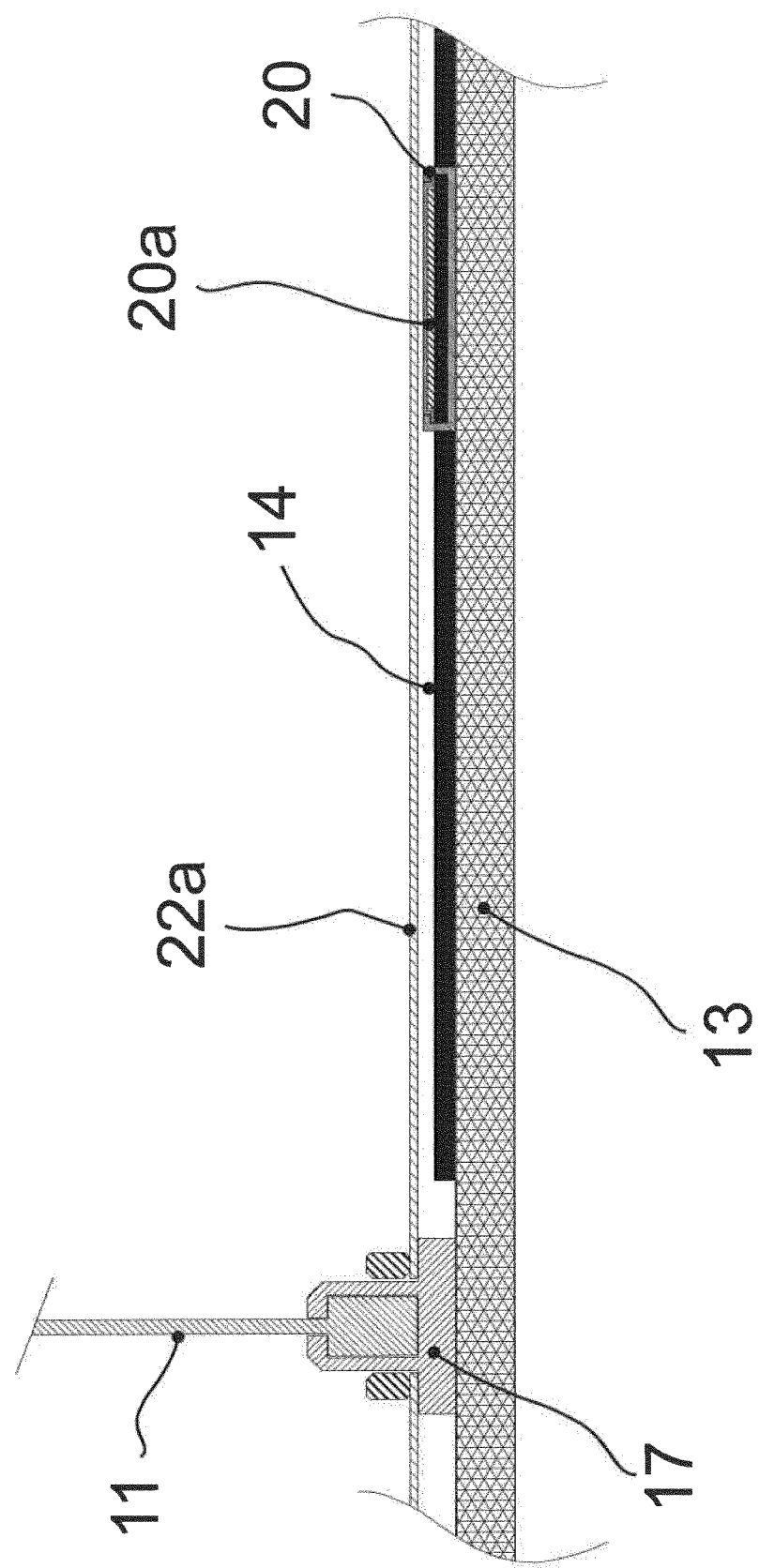
FIG. 5 shows an enlarged detail from the side view in FIG. 4.

FIG. 5 shows an enlarged detail section from the left-hand region of FIG. 4. There one can discern the electrical supply cable in the region of the suspension fitting 11, which at its lower end makes contact in an electrically conducting and preferably externally insulated manner with the contact flange 17, which in turn is attached onto the carrier plate 13, for example by means of an adhesive bond, a screwed connection, or other suitable technologies. The contact surface of the contact flange 17 can be soldered or brazed onto a conducting track 18, 19, which is not represented in FIG. 5, wherein as a general rule the conducting track can be very thin when compared with the dimensions of the contact flange 17.

In FIG. 5 part of an OLED panel 14 can also be discerned, together with one of the contact shoes 20, via which power is then conducted from the conducting track to the corresponding pole of the OLED panel 14. The contact shoe 20 is attached onto the carrier plate 13 by suitable methods; for example, it is adhesively bonded onto the carrier plate 13, and soldered or brazed onto the conducting track. Moreover, the contact shoe has a type of clamping device, for example with an approximately plate-form clamping part, which can be pushed over the OLED panel 14 and thereby holds the OLED panel 14 securely on the carrier plate. The said clamping device can, for example, be detachable, so that one can replace the OLED panel as required for servicing purposes. The contact shoe also has, for example, a plate-form contact means, for example a printed circuit board 20a, which, as can be discerned in FIG. 5, fits against the OLED panel and makes contact with the latter. Thus the contact shoe 20 fulfils two functions, on the one hand it holds the OLED panel securely on the carrier plate 13, and on the other hand it supplies the OLED panel with voltage, which it in turn taps from the electrical conducting track 18, 19 (see FIG. 3), which leads on the upper surface of the carrier plate 13 to the contact flange 17. In order that the OLED panels 14, 15, 16 on the upper side of the carrier plate 13 are not visible to the observer, one can provide, for example, an approximately plate-form covering 22a, which is held, for example, at its outer ends on the carrier plate (see FIG. 4), and which runs at some distance above the carrier plate 13, and covers the OLED panels and the contact shoes 20. The said covering 22a can, for example, consist of a thin sheet of metal or similar, and serves to provide an aesthetically attractive appearance for the lamp.

Figure 6:
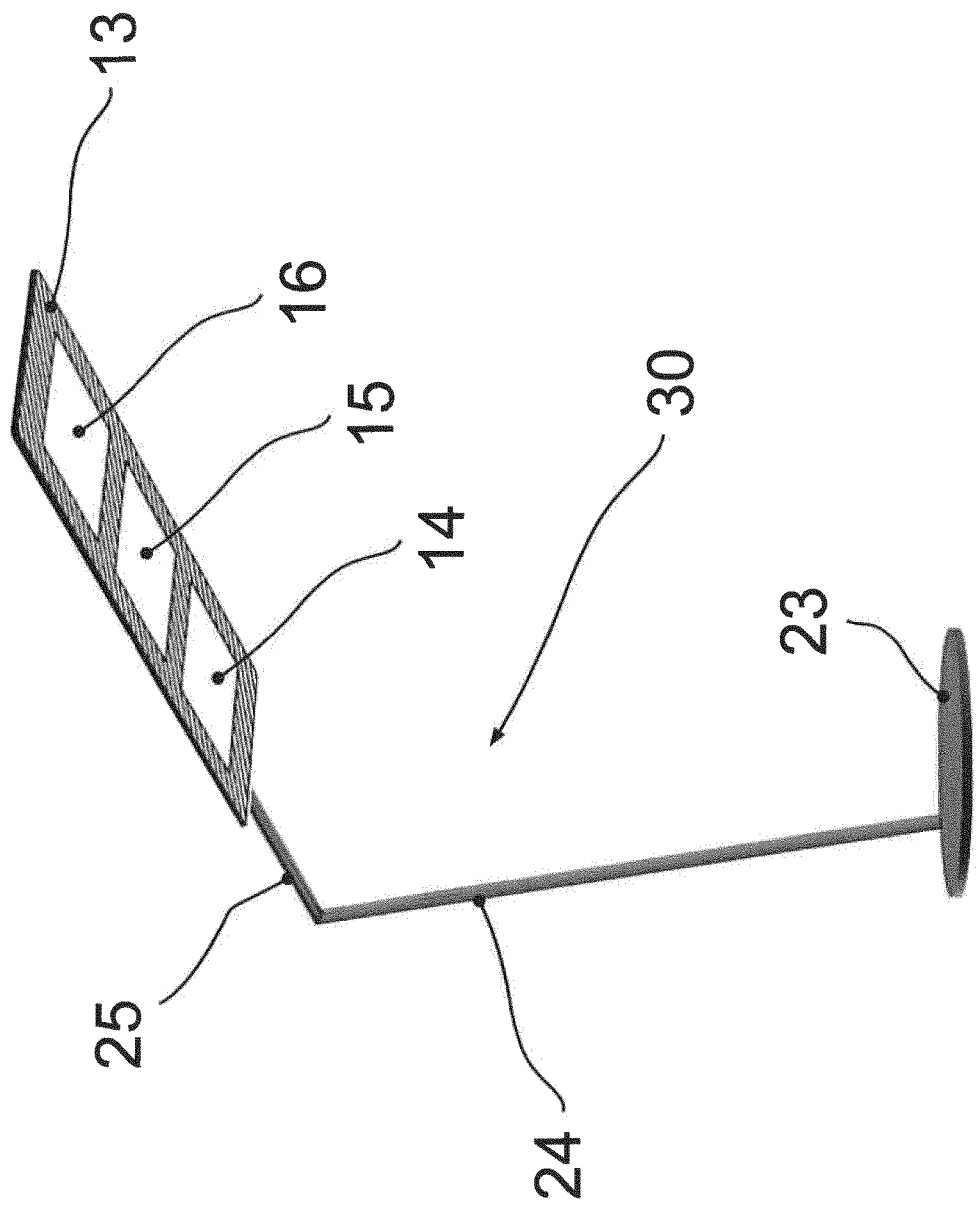
FIG. 6 shows a schematically simplified perspective view of an exemplary inventive table lamp.

FIG. 6 represents an alternative example of embodiment to FIG. 1; this shows another type of lamp, in which the above-described construction, that is to say, the type of arrangement of OLED panels on a carrier plate, and the establishment of contact with the OLED panels, can take place in accordance with the same basic principle of the present invention. FIG. 6 shows a table lamp 30 with a lamp base 23, a Upright tube 24, a lamp arm 25 emanating at an angle from the other end of the Upright tube in the form of a cantilever, and a lamp section attached in an overhanging manner to the lamp arm, which lamp section has a carrier plate 13 with OLED panels 14, 15, 16. As can be seen, here too a carrier plate 13 can be provided that is, for example, approximately rectangular in outline, on which in turn are fitted a plurality of OLED panels that are, for example, rectangular in outline and arranged in a row, with their light emission taking place downwards. Pendant lamps 10 of the type shown in FIG. 1 and table lamps 30 of the type shown in FIG. 6 can therefore show an analogous structure, and can thus be part of a family of lamps.

Figure 7A:
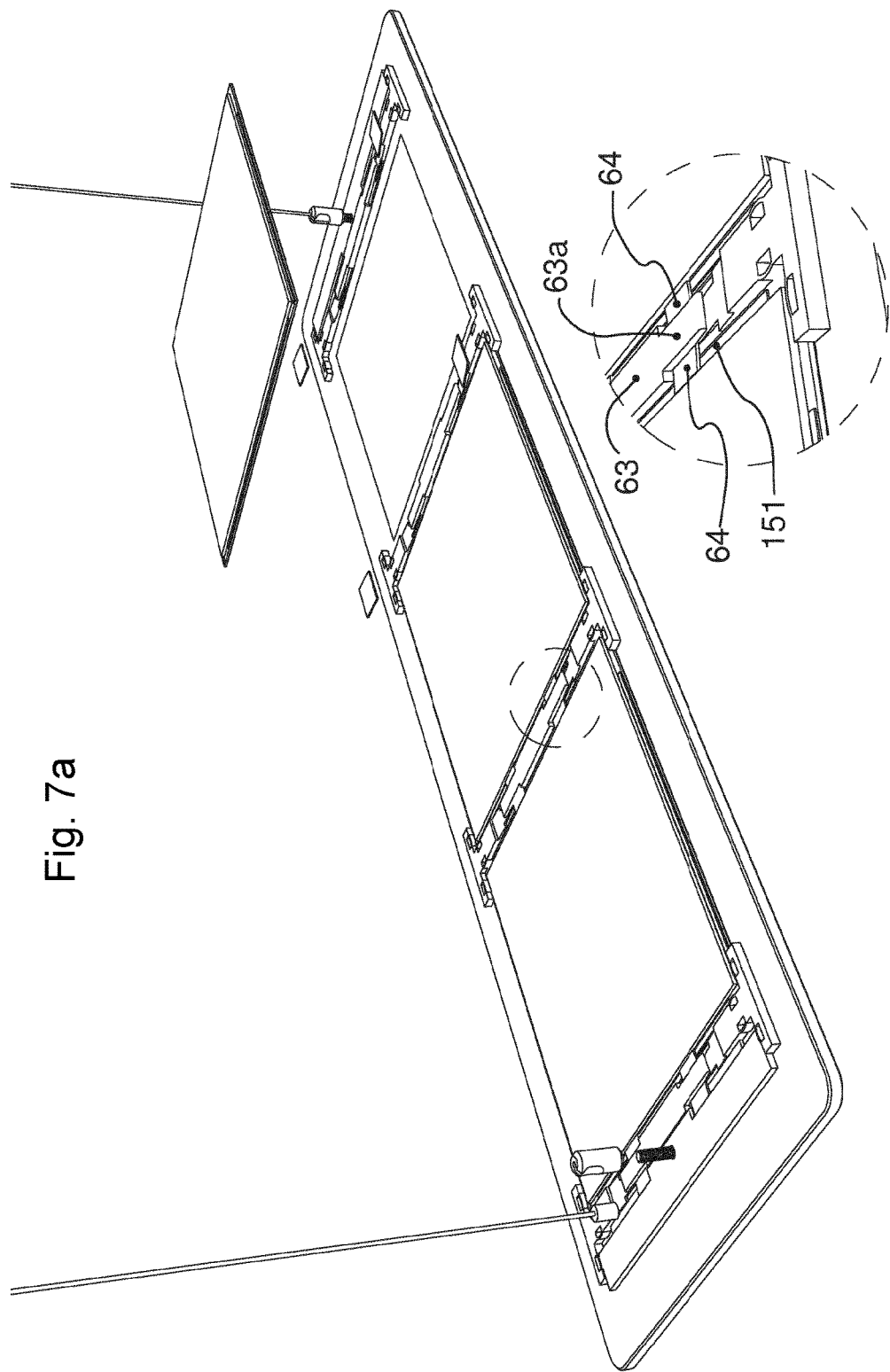
FIG. 7a shows an enlarged detail section from the representation according to FIG. 7.

In what follows reference is made to FIGS. 7 and 7a, and with the aid of these perspective representations a further alternative example of embodiment of an inventive lamp is explained in more detail. In this variant the establishment of contact with the OLED panels is achieved in a somewhat different manner than is the case in the example of embodiment in FIGS. 3 to 5. However, in FIG. 7 the same components are allocated the same reference symbols as in the previously described examples. In the variant according to FIG. 7 a carrier plate 13 is also provided with an elongated rectangular outline; this consists, at least in the region in which the light is emitted downwards, of a transparent or translucent material, in particular of glass or acrylic glass. A plurality of OLED panels 14, 15, 16, rectangular in outline, is fitted onto this carrier plate 13. The light-radiating side of the OLED panel is here directed downwards and towards the carrier plate 13, so that the OLED panel radiates its light through the carrier plate and downward. Here this therefore takes the form of a directly radiating lamp.

The attachment of the OLED panels 14, 15, 16 onto the carrier plate 13 is detachable, so that the advantage exists that an OLED panel that is no longer functional can be replaced as required. This detachable attachment takes place by means of a clamping connection. In the drawing in FIG. 7 the two left-hand OLED panels 14, 15 are shown in the attached position, while the right-hand OLED panel 16 is not yet attached and is represented in an exploded view.

In the region of the lamp attachment, for example a suspension fitting, if the lamp takes the form of a pendant lamp, wherein here only the threaded pins 61 indicate the said attachment, a contact flange 17 is located in each case.

Here the said contact flange 17 is flat, in the shape of a bar, electrically conducting, extends in the transverse direction of the carrier plate 13, and fits against the upper side of the latter. In order to bring the OLED panel that is to be attached into an accurate attachment position, positioning elements 62 are fitted at the four corners of an OLED panel 14, 15, 16 on the carrier plate; these have right-angled locating edges for the OLED panels. The contact shoes are here designed in two parts, and comprise clamping elements 63, which can consist of an insulating material, together with smaller printed circuit board-type contact elements 64, which consist of a material with good electrical conductivity, as a general rule of a metal such as, for example, copper, or similar. The contact elements 64 can be discerned in the case of the right-hand OLED panel, where they are represented separately, whereas in the case of the left-hand OLED panel 14 they are partially covered and are therefore difficult to discern. The combination of the clamping elements 63, which as a general rule are fixed onto the carrier plate 13 and the plate-type contact elements 64 allows the dual function of simultaneous establishment of contact with the OLED panel 14, 15, 16 and clamping of the latter onto the carrier plate 13.

For this purpose the contact elements 64, as indicated in the case of the right-hand OLED panel 16 in FIG. 7, are on one side pushed under extensions 63a of the clamping elements 63 spaced apart from the carrier plate 13. Here the contact elements 64 come into contact at the same time with strip-form or tongue-type surfaces 151, which extend along one edge of the OLED panel, and by means of a projection are offset relative to the latter. The said strip-form surfaces 151 represent the contact strips of the OLED panel 14, 15, 16 and are designed as either an anode or a cathode. Thus in the case of the OLED panel shown in FIG. 7 the anode and the cathode are respectively located on side edges of the OLED that are located opposite one another, wherein the OLED panel is positioned on the carrier plate 13 such that the anode and cathode in each case extend in the transverse direction of the carrier plate 13. If a contact element 64 is pushed in, it makes contact at one and the same time on the one side (e.g. the left-hand side) with the cathode of one OLED panel, and on the other side (e.g. the right-hand side) with the anode of the adjacent OLED panel 15, so that in this variant the OLED panels 14, 15, 16, are connected in series. Here in principle one contact element 64 would be sufficient, but for reasons of symmetry in each case two of the said contact elements 64 are respectively arranged between two OLED panels 15, 16, as one can discern in FIG. 7. Since when making the contact the contact element 64 is pushed under the extension 63a of the clamping element 63, and since the contact element 64 pushes from above onto the strip-form surface 151 of the OLED panel 16, the OLED panel is thereby held on the carrier plate 13 in a clamped manner, and can no longer lift off upwards. Since the OLED panels with their strip-form surfaces along the lateral edges are designed in a very delicate manner, it has proved to be advantageous to design the clamping elements 63 and contact elements 64 as separate components for purposes of simplifying manipulation. (In the present application the entity of clamping element 63 and contact element 64 is designated as a "contact shoe".) Thus manipulation during assembly is made easier, and the contact elements 64 are pushed in from above, approximately in the transverse direction of the carrier plate 13, as is indicated in FIG. 7. Here they are pushed under the extensions 63a, and at the same time over the strip-form surfaces 151, so that the clamping action basically develops only as a result of the interaction between the contact elements 64 and the clamping elements 63. In the case of the OLED panel 14 located at the end of the row, the contact elements 64, which are pushed under the clamping elements 63 make contact on the one hand with an electrode (here a cathode) of the left-hand OLED panel 14 and on the other hand on their left-hand side with the contact flange 17, so that the power is extracted from the contact flanges 17 and at one and the same time contact is made with the left-hand OLED panel and on its one side it is attached onto the carrier plate 13 in a clamped manner. The contact flange 17 can, for example, be adhesively bonded, or screwed, onto the carrier plate 13. An adhesive bond has the advantage that it does not require any hole to be made in the carrier plate 13, which consists, for example, of glass.

In FIG. 7a, which shows an enlarged detail section from FIG. 7 at the identified position, one can discern a contact element 64 that is already attached in the clamping position, in which it is pushed under the extension 63a of the clamping element 63. One sees that the contact element 64 is somewhat wider than the extension 63a, so that when it lies under the extension 63a it projects on both sides beyond the latter. The said two projections come to bear against the strip-form surfaces 151 of the OLED panel 15, and thus hold the latter on the carrier plate 13. In FIG. 7a one can also easily discern that a single contact element 64 in this manner makes contact at one and the same time with the respective strip-form surfaces 151 of two OLED panels adjacent to one another, wherein in the case of one OLED panel contact is made with the plus pole, and in the other with the minus pole.

Figure 8:
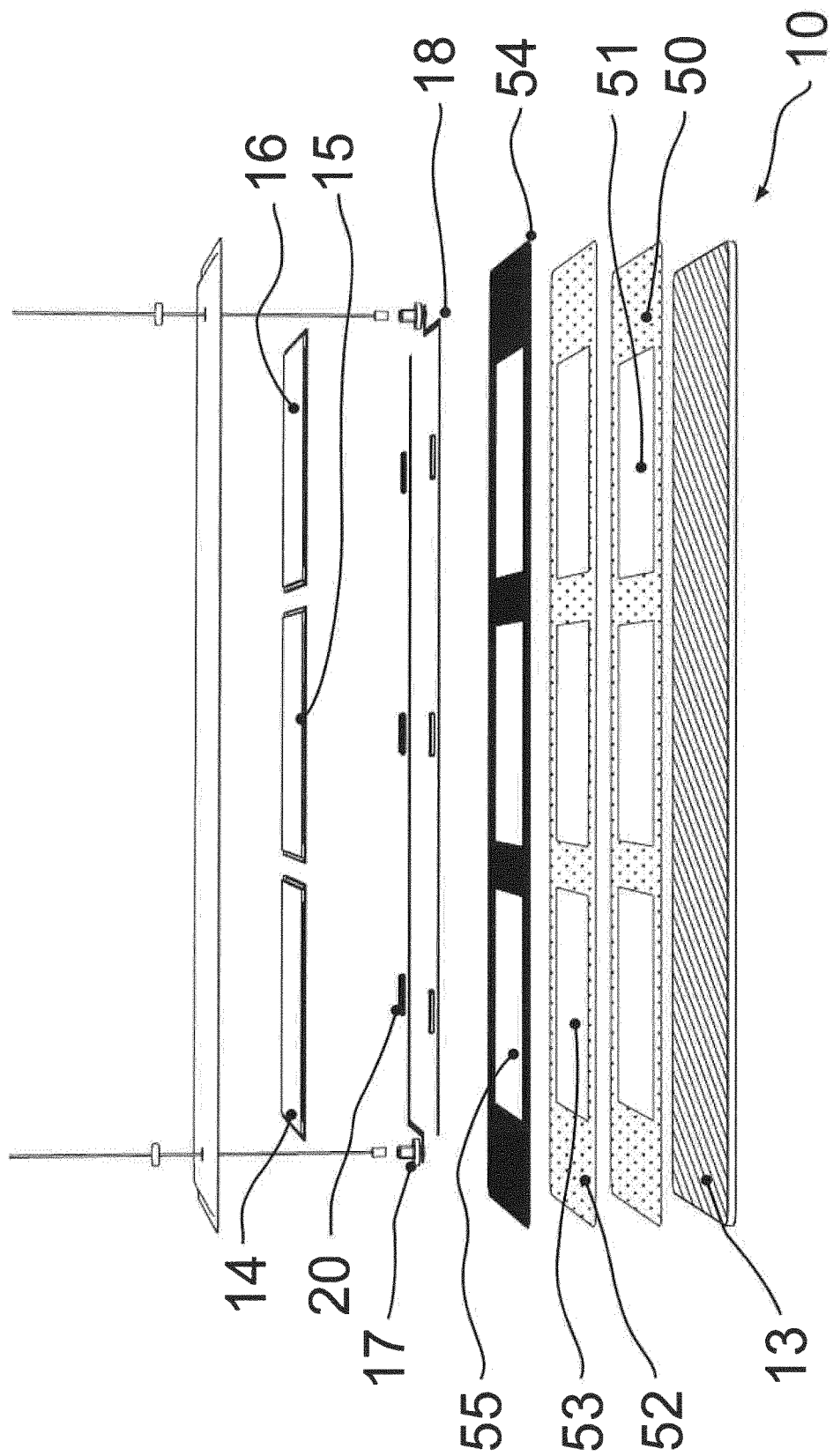
FIG. 8 shows an exploded view in perspective of a further exemplary inventive lamp, in which it takes the form of a pendant lamp.

In what follows reference is made to FIG. 8, and with the aid of the latter a further example of embodiment of the present invention is explained in more detail. In a schematically simplified manner the representation shows a pendant lamp 10 in an oblique view from above, in which the light is emitted downwards. The lamp has a carrier plate 13, which has multiple printings on its rear side (corresponding in this case to the upper side), which is facing away from the observer when the lamp is suspended. In principle the construction of the pendant lamp 10 in FIG. 8 can correspond to that in the above-described example of embodiment in FIGS. 1 to 5, so that with regard to the details regarding the establishment of contact with the OLED panel, the printed-on conducting tracks, the suspension fitting of the lamp, etc. reference can be made to the description of FIGS. 1 to 5.

FIG. 8 shows the multiple printings for the pendant lamp 10. Here the rear side of the carrier plate is firstly provided with a first printing 50, in which three approximately rectangular surface areas 51 are omitted, since the OLED panels 14, 15, 16, are later fitted in these omitted surface areas. The said first printing thus forms a type of virtual frame for the OLED panels. The printing is a very thin layer, and can, for example, be applied by means of screen printing, and consists, for example, of ceramic pigments that are electrically insulating. These pigments can have a light colour; they are, for example, white. Since only the approximately rectangular regions are omitted for the later application of the OLED panels, and the carrier plate 13 in its other regions is printed two-dimensionally and comparatively densely, surfaces are created in the printed regions 50 around the OLED panels and between the OLED panels, which make the carrier plate 13, which is predominantly transparent/light-transmissive, opaque. Thus these surfaces 50 can later accommodate clamping devices 20 for the OLED panels, contact flanges 17 in the region of the suspension fittings of the lamp 10, conducting tracks 18 for the power supply to the OLED panels and electronic components such as the constant current source 27, the monitoring electronics circuit 28, and similar, which can no longer be detected from the lower side of the carrier plate 13 from which the light is emitted.

In the course of development of the inventive lamp it has been established that one printing 50 on its own with light pigments, if it is very thin, is on occasions insufficient to ensure the desired opaqueness to a sufficient degree. In such a case it is therefore advantageous if a second printing 52, is subsequently applied, in which the same regions 53 can be omitted as in the case of the first printing 50. The said second printing 52 can, for example, be applied once again with a light, e.g. white, ceramic pigment and is preferably also very thin, for example in the μm-range, or even thinner.

In the example of embodiment in FIG. 8 a further third printing 54 is provided; this is applied following the second printing 52, and once again approximately rectangular regions 55 are omitted, in which the OLED panels are subsequently fitted. In the example the said third printing takes the form of a dark, e.g. black or grey printing, by means of which, on the one hand the desired opaqueness is achieved to a great extent, if in this regard the two preceding light printings 50, 52, are insufficient, wherein the third printing can have another advantageous effect, in that it achieves a higher contrast, and thus a better visual impression for the regions covered by the multiple printings. After the application of the printing, here in three layers, the conducting tracks 18, for example, can then also be printed onto the intended positions, for which purpose an electrically conducting pigment, for example one with a silver content, can be used. After this there then follows the further assembly of the lamp with the fitting of the contact flanges 17, the clamping devices 20, and the OLED panels 14, 15, 16, in which context reference is also made to the embodiments in FIGS. 1 to 5.

Figure 9:
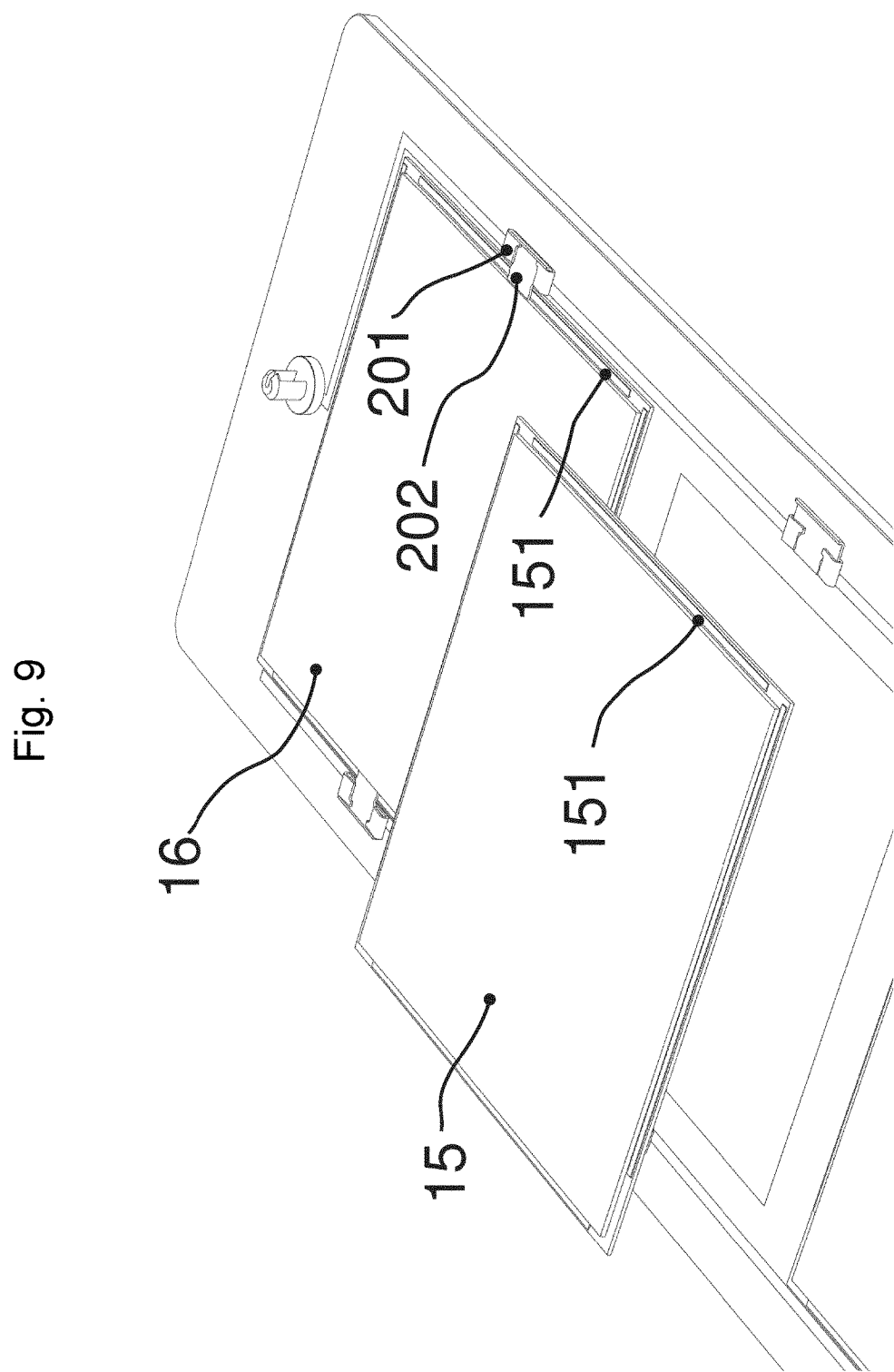
FIG. 9 shows a perspective detail of an exemplary inventive pendant lamp according to the example of embodiment of FIGS. 1 to 5.

With reference to the detail view in FIG. 9, the function of the clamping devices 20 in a lamp of the inventive type, as is described, for example, in FIGS. 1 to 5, is explained in more detail in what follows. In the representation according to FIG. 9 one of the OLED panels 15 is represented in a state in which it is not yet assembled, and another OLED panel 16 beside it is shown in the assembled state. By this means the positioning of the clamping devices 20, which differs in each case, becomes clear. The clamping devices 20 consist in principle of two parts that can move relative to one another, namely a strap 201, which has a fixed position on the carrier plate 13. The said strap 201 serves to receive a slider 202, which can be moved relative to the strap 201 in an approximately horizontal direction, that is to say approximately parallel to the plane of the OLED panel, wherein the strap overlaps the slider, and the latter by this means is guided in its movement. In the case of the non-assembled OLED panel 15, the slider 202 is located in a retracted position. After the OLED panel has been fitted against the carrier plate the slider 202 of the clamping device is pushed forward and thereby slides over a tongue-type or strip-form surface 151 of the OLED panel, which can extend along one edge of the OLED panel and is offset, for example, relative to the other surface of the OLED panel by a projection, that is to say, it is lower than the OLED panel in other regions. By means of this process of pushing the slider 202 forward the strip-form surface 151 of the OLED panel is overlapped, and thus the OLED panel is held in a clamped manner, since the slider 202 engages over the strip 151, so that the OLED panel can no longer lift off upwards.

Figure 10:
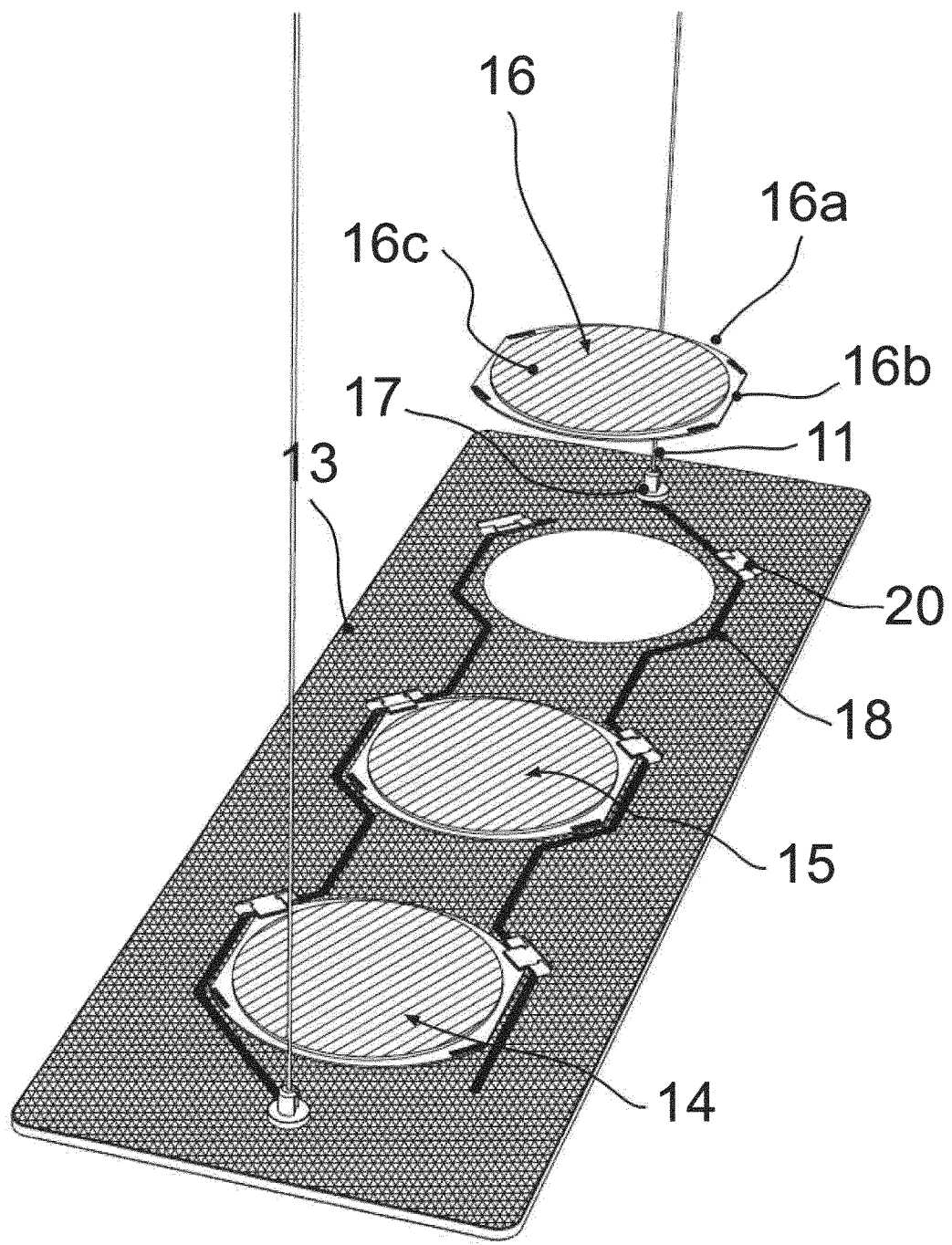
FIG. 10 shows a view of an alternative inventive lamp, in which the OLED panels have another outline shape.

In what follows a further alternative example of embodiment of the present invention is described in more detail with reference to FIG. 10; in this example of embodiment OLED panels with another outline shape are provided. Here three OLED panels 14, 15, 16 are present, in which the light-emitting surface 16c has a round outline. The edge regions of the said OLED panels 14, 15, 16, which are attached by means of the clamping devices 20, in some sections 16a of the periphery run in a partly curved form; in other sections 16b, on the other hand, they are straight. Corresponding to the somewhat different outline shape of the OLED panels 14, 15, 16, the position of the clamping devices 20 on the carrier plate 13 differs somewhat from that in the previously described examples of embodiment. Here, contact is made, for example, in the edge regions of the OLED panels, with the aid of two clamping devices with contact elements 20 for each OLED panel, wherein, for example, for adjacent OLED panels the contact elements of the same polarity can be respectively connected in parallel, and via conducting tracks 18 on the carrier plate are electrically connected with one another, wherein the said conducting tracks 18 run to the contact flanges 17, which are respectively located in the region of the suspension fitting 11 of the lamp.

LIST OF REFERENCE NUMERALS

10 Pendant lamp
11 Suspension fitting
12 Suspension fitting
13 Carrier plate
14 OLED panel
15 OLED panel
151 Strip-form surface
16 OLED panel
16a Curved sections of the periphery
16b Straight sections of the periphery
16c Light-emission surface
17 Contact flange
18 Conducting track
19 Conducting track
19a Conducting track
19b Conducting track
20 Clamping device
20a Printed circuit board
201 Strap
202 Slider
21 Contact shoe
22 Power supply
22a Plate-form covering
23 Lamp foot
24 Upright tube
25 Lamp arm
26a Feeder cable
26b Feeder cable
26c Feeder cable
26d Feeder cable
26e Feeder cable
26f Feeder cable
27 Constant current source
28 Monitoring electronics circuit
29 Contacts
30 Table lamp
50 First printing
51 Omitted surfaces
52 Second printing
53 Omitted regions
54 Third printing
55 Omitted regions
61 Threaded pins
62 Positioning elements
63 Clamping elements
63a Extensions
64 Contact elements

The invention claimed is:

1. A lamp comprising at least one OLED lighting means lying flat on an at least partially light-transmissive carrier plate (13) and formed as an OLED panel (14, 15, 16), wherein at least two contact shoes (20, 21) respectively assigned to an OLED panel (14, 15, 16) are attached on a rear side of the carrier plate (13) that is facing away from a light-emitting side, which respectively comprise means for making contact with one pole respectively of the OLED panel, wherein
at least one contact shoe (20, 21) has an attachment device, by means of which the OLED panel (14, 15, 16) is attached onto the carrier plate (13); the attachment device is a clamping device, by means of which the OLED panel is attached in a clamped manner,
characterized in that two or a plurality of OLED panels (14, 15, 16) are arranged on the rear side of the at least partially light-transmissive carrier plate (13), facing away from the light-emitting side, and at least one contact flange (17) is attached on or to the carrier plate (13), which is in conducting contact with a conducting track (18, 19) fitted on the carrier plate, which leads from the contact flange to one or a plurality of contact shoes (20, 21) respectively assigned to the OLED panels (14, 15, 16).

2. The lamp according to claim 1, characterized in that at least one contact shoe (20, 21) has a plate-form element, comprising a printed circuit board (20a), as a means for making contact with a pole of the OLED panel (14, 15, 16).

3. The lamp according to claim 1, characterized in that at least one contact shoe (20, 21) is attached onto a surface of the carrier plate (13), made of glass or a transparent plastic, facing towards the OLED panel (14, 15, 16), by means of adhesive bonding onto the carrier plate.

4. The lamp according to claim 1, characterized in that conducting tracks (18, 19) are applied onto the carrier plate (13), and at least one contact shoe (20, 21) is soldered or brazed onto a conducting track, making a conducting connection.

5. The lamp according to claim 1, characterized in that at least one contact flange (17), which is in conducting contact with at least one conducting track (18, 19) applied onto the carrier plate (13), is arranged proximate to a suspension fitting (11, 12) or attachment of the lamp (10).

6. The lamp according to claim 1, wherein the lamp is a pendant lamp (10), and at least one contact flange (17) is arranged proximate to a suspension fitting (11, 12) of the lamp, wherein an electrical supply cable of the lamp feeds through the suspension fitting of the lamp to the contact flange, and at a lower end is in electrically conducting connection with the lamp.

7. The lamp according to claim 1, characterized in that at least the surface of the light-transmissive carrier plate (13), facing towards the OLED panel (14, 15, 16), and to be connected detachably with the OLED panel, consists of glass or a transparent plastic and, on the light-emitting side, the carrier plate (13) is matted at least in sub-regions, in particular by means of etching, sandblasting, grinding, lasering, or milling or, on the rear side, facing away from the light-emitting side, the carrier plate (13) is coated or printed, at least in sub-regions.

8. The lamp according to claim 7, characterized in that on the rear side, facing away from the light-emitting side, the carrier plate (13) is coated, pasted, matted or printed in sub-regions in which are located attachment elements and/or contact elements for the OLED panel, and/or conducting tracks, wherein on the rear side, facing away from the light-emitting side, the carrier plate (13) is two-dimensionally printed, pasted, matted, or coated with at least one layer in the form of a frame, wherein the said printing, pasting, matting, or coating omits the light-emitting surfaces, onto which the one or more OLED panels (14, 15, 16) are fitted.

9. The lamp according to claim 8, characterized in that on the rear side, facing away from the light-emitting side, the carrier plate (13) has at least one printing (50, 52, 54), pasting, or coating with an electrically insulating material and/or, on the rear side, facing away from the light-emitting side, the carrier plate (13) has at least one printing (50, 52), or coating with light pigments, or dyes.

10. The lamp according to claim 8, characterized in that on the rear side, facing away from the light-emitting side, the carrier plate (13) has at least two layers of printing (50, 52, 54), pasting, matting, or coating, applied in successive steps, wherein the printing, pasting, matting or coating of a plurality of layers located one above another is approximately congruent in each case, and in each case omits the light-emitting surfaces of the OLED panel wherein the rear side of the carrier plate, facing away from the light-emitting side, has a double, triple or multiple printing (50, 52, 54), pasting, or coating of approximately congruent surfaces, wherein at least one printing (50, 52), pasting or coating is provided with a light pigment or dye, and at least one printing (54), pasting or coating is provided with a dark pigment or dye.

11. The lamp according to claim 8, wherein the lamp is a lighting shelf, a lighting panel, an electrical appliance, a household appliance, an item of urban furniture, a facade element, a wall element, a ceiling element, an exterior lamp of a motor vehicle, or an installation fitting of a motor vehicle, rail vehicle, ship, or aircraft.

12. The lamp according to claim 1, characterized in that a plate-form covering (22a) is provided on the side of the carrier plate (13) facing away from the light-emitting side, which covering covers the OLED panels (14, 15, 16).

13. The lamp according to claim 1, wherein the lamp is a pendant lamp (10), a suspended lamp, a surface-mounted ceiling lamp, a recessed ceiling lamp, a surface-mounted wall lamp, a recessed wall lamp, a standard lamp or a table lamp (30) or is a mobile lamp, a mirror lamp, a furniture lamp, or an illuminable furniture element, an exterior lamp, a recessed floor lamp, a surface mounted floor lamp, a street lamp, an orientation lamp, a lamp for emergency lighting, or an information lamp.

14. The lamp according to claim 1, wherein contact is made with a pole of the said OLED panels, arranged in a row, by a respective common conducting track (18, 19) and/or with a plurality of OLED panels, connected in a parallel circuit, or in a series circuit, by means of contact shoes (20, 21) and conducting tracks (18, 19).

15. The lamp according to claim 1, characterized in that contact is made with at least two OLED panels, connected in a parallel circuit, by means of conducting tracks, wherein for each OLED panel a constant current source, or a current limiter is provided, and/or a monitoring electronics circuit is provided for each OLED panel, wherein the monitoring electronics circuit is arranged in a conducting path between the constant current source, or current limiter, and the contacts of the OLED panel.

16. A lamp comprising at least one OLED lighting means lying flat on an at least partially light-transmissive carrier plate (13) and formed as an OLED panel (14, 15, 16), wherein at least two contact shoes (63, 64) respectively assigned to an OLED panel (14, 15, 16) are attached onto a rear side of the carrier plate (13) that is facing away from the light-emitting side, which contact shoes (63, 64) respectively comprise means for making contact with one pole respectively of the OLED panel, wherein at least one contact shoe (63, 64) has an attachment device, by means of which the OLED panel (14, 15, 16) is attached onto the carrier plate (13); the attachment device is a clamping device, by means of which the OLED panel is attached in a clamped manner, characterized in that two or a plurality of OLED panels (14, 15, 16) are arranged on the rear side of the at least partially light-transmissive carrier plate (13), facing away from the light-emitting side, and at least one contact flange (17) is attached on or to the carrier plate (13), which is in conducting contact with a contact shoe (63, 64) arranged on the carrier plate, which contact shoe (63, 64) makes contact with at least one OLED panel (14, 15, 16).

17. The lamp according to claim 16, characterized in that at least one contact shoe (63, 64) is provided, which respectively makes contact with the contact regions (151) of two adjacent OLED panels (14, 15; 15, 16), wherein in one OLED panel contact is made with a plus pole, and in the other OLED panel with a minus pole.

18. The lamp according to claim 16, characterized in that at least one contact shoe is designed in two parts, and comprises a clamping element (63) is fixed onto the carrier plate (13), and at least one contact element (64) is detachably connected with the clamping element, which contact element makes contact with the contact region (151) of the one or more OLED panels (14, 15, 16).

19. The lamp according to claim 16, characterized in that the OLED panels (14, 15, 16) have contact regions (151) extending along an edge and at least one contact element in the assembled state (64) presses from above onto the said contact region (151), and thereby makes contact with the OLED panel and at the same time clamps the OLED panel onto the carrier plate (13).

\* \* \* \* \*